(12) United States Patent
Bilac et al.

(10) Patent No.: US 8,023,235 B2
(45) Date of Patent: Sep. 20, 2011

(54) MULTIFUNCTIONAL RESIDENTIAL CIRCUIT BREAKER

(75) Inventors: Mario Bilac, Lawrenceville, GA (US); Carlos Restrepo, Atlanta, GA (US); Hugh T. Kinsel, Sugar Hill, GA (US); Amit Nayak, Atlanta, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 402 days.

(21) Appl. No.: 12/405,340

(22) Filed: Mar. 17, 2009

(65) Prior Publication Data

US 2009/0198459 A1   Aug. 6, 2009

Related U.S. Application Data

(63) Continuation-in-part of application No. 11/978,969, filed on Oct. 30, 2007, now Pat. No. 7,864,492.

(60) Provisional application No. 61/042,916, filed on Apr. 7, 2008.

(51) Int. Cl.
*H02H 3/00* (2006.01)
(52) U.S. Cl. ............ 361/42; 361/93.1; 361/94; 324/500
(58) Field of Classification Search .................... 361/42, 361/93.1, 94, 45; 324/500
See application file for complete search history.

(56) References Cited

U.S. PATENT DOCUMENTS

| | | | |
|---|---|---|---|
| 7,187,181 B2 * | 3/2007 | Parker | 324/536 |
| 7,408,750 B2 * | 8/2008 | Pellon et al. | 361/42 |
| 2006/0203401 A1 * | 9/2006 | Kojori et al. | 361/42 |
| 2007/0247767 A1 * | 10/2007 | Zhang | 361/42 |
| 2008/0007879 A1 * | 1/2008 | Zaretsky et al. | 361/42 |

* cited by examiner

*Primary Examiner* — Patrick Salce
(74) *Attorney, Agent, or Firm* — Jose R. de la Rosa

(57) ABSTRACT

An electrical fault detection device for use in a branch of a power circuit that utilizes signals from an AC line current sensor coupled to an electrical distribution line having a primary and neutral lines, a line high-frequency sensor coupled to the electrical distribution line, a differential current sensor coupled to the primary and neutral lines, and a ground fault current sensor coupled to the primary and neutral lines. A signal conditioner receives the signals outputted by AC current line current sensor, the line high frequency sensor, the differential current sensor and the ground fault current sensor and generates a signal indicative of the load current associated with a branch of the power circuit. Output of the signal conditioner is sampled and processed by a processing resource. The processing resource has stored therein data representing a plurality of time-versus-current curves that define a plurality of regions in which tripping may or may not occur. One region has time data and current data that define a time-duration for a particular current magnitude for which no tripping will occur. Another region has time data and current data that define a time-duration of a particular current magnitude for which tripping will occur. Processing resource processes sampled signal to determine the region to which the processed time data and current data correspond, and generates a signal to initiate tripping if the sampled signal yields a time duration for a particular current magnitude that corresponds to a region for which tripping must occur.

13 Claims, 15 Drawing Sheets

NORMAL AC CURRENT

HALF WAVE RECTIFIED ARC FAULT COUPLED AC CURRENT

ZERO CROSSING MASK

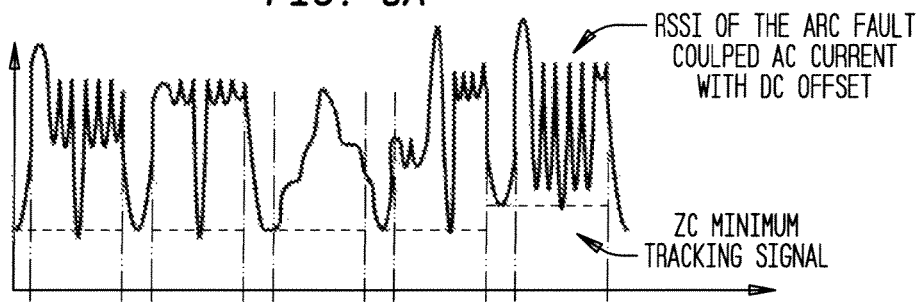
FIG. 8A
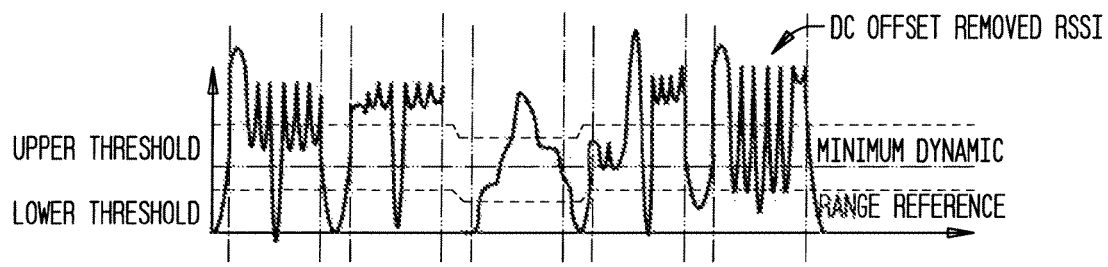
FIG. 8B
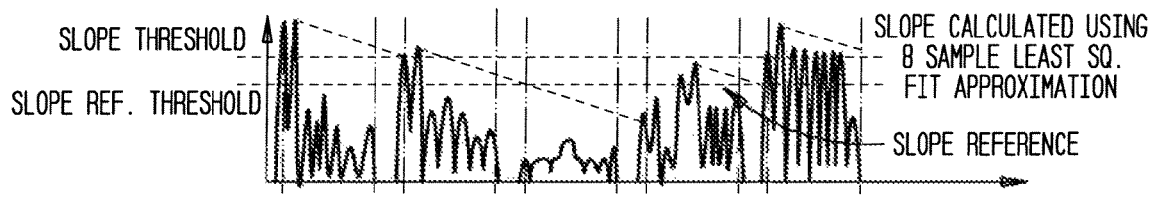
FIG. 8C
FIG. 8D
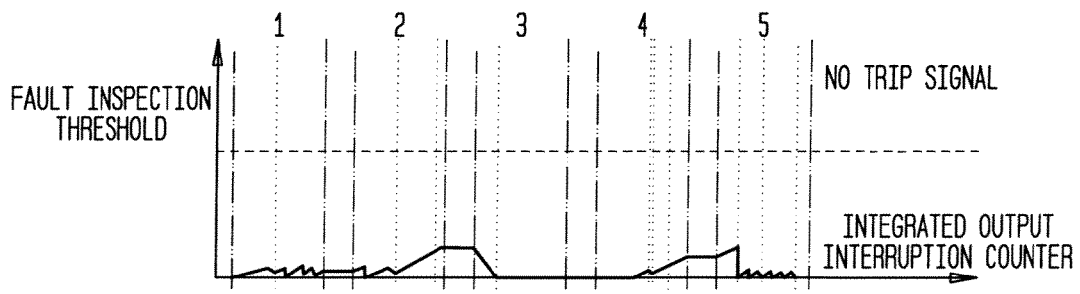

MULTIFUNCTIONAL RESIDENTIAL CIRCUIT BREAKER

CROSS-REFERENCE TO RELATED APPLICATIONS

This application is a continuation-in-part of pending U.S. application Ser. No. 11/978,969, filed Oct. 30, 2007, now United States Patent Application Publication No. 20080106832, which claims the benefit of U.S. provisional application No. 60/855,424, filed Oct. 31, 2006. The entire disclosures of the aforesaid application Ser. Nos. 11/978,969 and 60/855,424 and publication no. 20080106832 are herein incorporated by reference.

This application also claims priority to and the benefit of the filing date of pending U.S. provisional application No. 61/042,916, filed on Apr. 7, 2008, entitled "Multifunctional Residential Circuit Breaker," the entire disclosure of which is hereby incorporated by reference.

TECHNICAL FIELD

The present invention relates generally to fault detection in electrical circuits. More particularly the invention is directed to systems and methods for detecting and mitigating arc faults in electrical systems. The invention also relates to multifunctional residential circuit breaker.

BACKGROUND ART

Electrical arcs can develop temperatures well above the ignition level of most common flammable materials and, therefore, pose a significant fire hazard. For example, worn power cords in the home may arc sufficiently to start a fire. Fortunately, low-voltage arcing is an inherently unstable phenomenon and does not usually persist long enough to start a fire. Under certain conditions, reflected in particular characteristics of the electrical disturbance produced, the likelihood of the arc persisting and starting a fire is much higher.

Two types of dangerous arcing that are likely to occur in the home are momentary, high-energy arcs caused by high-current faults and persistent, low-current "contact" arcing. A high-current fault, caused by an inadvertent direct connection between line and neutral or line and ground, will generally draw current up to or beyond the rated capacity of the circuit, arc explosively as the contacts are physically made and broken, dim lights and other loads indicating an excessive load is being drawn, and/or (assuming the circuit is properly protected by a circuit breaker) trip the breaker, thereby interrupting the current to the arc. Because such "line faults" are short-lived, the temperature rise in the feed conductors is limited and the fire danger results primarily from the explosive expulsion of minute glowing globules of copper from the contact area which may ignite nearby flammable materials. Even if a fire begins, however, the high visibility of the fault and the likely presence of someone nearby (who provided the physical impetus to bring the conductors together) sharply mitigates the potential for an uncontrolled fire.

Contact arcing on the other hand, is arcing that occurs at connections in series with a load. As such, the maximum current in the arc is limited to the load current and, therefore, may be substantially below the overcurrent or "trip" rating of an associated circuit breaker. Contact arcing is a complex physical phenomenon that may be induced by loose connections, oxidized contacts, foreign non-conducting material interfering with the conduction path, differences in contact materials, contact shapes, and other factors. Under certain conditions, such arcing may become persistent and present a substantial fire hazard.

One example of a condition that may cause contact arcing is a well-used wall outlet wherein the spring pressure provided by the contacts has been reduced through age and use, so that insufficient pressure is applied to the inserted plug contacts to ensure low-resistance connection.

Contact arcing is also commonly caused by use of extension cords of insufficient current-carrying capacity. For example, the plug may be heated by resistance heating, gradually decomposing elastomeric insulating material around the contacts until the material partially flows into the contact area, preventing proper contact from being made. This process may become regenerative as the initial arcing produces more heat, carbonizing the insulation and producing a thin insulating layer on the contact surface. A third cause of contact arcing often observed in aluminum wiring involves the oxidation of contacts. In this case a chemical process, principally oxidation, builds up a semi-conductive or non-conductive layer on the surface of the contacts. Preferably, when the contact material is susceptible to oxidation, the connection is made gas-tight to prevent oxygen from entering and promoting oxidation. However, if the connections become loose over time, oxidation begins and arcing can result. Contact arcing is also common when the springs that snap switches on or off become worn, increasing the time to closure and reducing the force that holds the contacts together.

A fifth example of contact arcing that is found to readily occur in residences is at the center contact of conventional light bulbs. Because the center contact is subjected to high temperatures and repeated use, it often becomes loose and oxidizes, thereby increasing the likelihood of arcing. When arcing occurs, the lamp contact, usually made of a low-melting-point solder, melts and reforms, either breaking the contact or establishing a new one. A common result in very old lamp fixtures is that arcing at the center contact or around the aluminum threads causes the lamp to become welded into the socket and therefore very difficult to remove.

Finally, high-resistance faults across the line are, in the present context, also considered contact arcing. Inadvertent "shorts" that exhibit enough resistance to prevent tripping of the circuit breaker may nonetheless produce arcing at the contact points, and are considered contact arcs. Frayed conductors that come into light or intermittent contact, or staples that inadvertently pierce wire insulation, can produce resistive shorts through contamination and oxide layers, particularly if moisture is present.

Most instances of contact arcing result from the gradual degeneration of current-carrying contacts. Dangerous arcs may begin as small and occasional arcing, gradually building up over time until the arcing becomes persistent enough to start a fire. Also, in sharp contrast to the visible nature of arcing produced by line faults, such as "hard" or "bolted" shorts, incipient contact arcing is often hidden from view, providing little or no indication of the impending danger. For this reason, it would be highly advantageous if contact arcing conditions could be detected early, and a warning provided before the danger due to the fault reaches a dangerous level.

It will thus be appreciated that there are fundamental differences between "hard shorts" and contact arcing. "Hard shorts" will generally involve high currents (>50 A) and will be explosive at the fault point contact, so that the fault will either burn itself out or trip a circuit breaker. Conventional circuit protection devices are normally adequate to guard against line fault arcing. By comparison, the average current drawn in contact arcing is no more than the current drawn by the load itself. Nevertheless, even low-current contact arcing, for example, a 60 watt light bulb on the end of a faulty extension cord, or a set of Christmas tree lights with faulty contacts, may release sufficient heat to cause a fire. Accordingly, conventional circuit breakers are inadequate to prevent dangerous conditions due to contact arcing.

A need also exists for a circuit breaker that, in addition to detecting arcing that may result in a fire, removes power from the load when hazardous arcing is present. Such a device could be conveniently packaged in much the same style as a conventional circuit breaker, or could be installed in an outlet similar to the currently available ground fault interrupters Because the load current flows through the circuit breaker, it is convenient in this application to monitor load current.

A need also exists for an arc detector that is immune to noise commonly present on household power lines, e.g., due to lamp dimmers, brush motors, carrier-current communications systems, switching transients, broadcast radio signals, and other types of noise signals that may have similar electrical characteristics as arc-faults. If not properly identified and rejected, these types of signals, which may be easily confused with arc-fault signals, may cause "nuisance" tripping of certain arc-fault circuit detectors. Accordingly, in an effort to reduce the negative effects of nuisance tripping and accurately respond to arc fault signals, systems and methods for identifying arc-faults in power systems may be required.

Current AFCI/GFCI breakers may only display the last trip condition after a fault event has occurred through the use visual indicators (i.e. flags). The indication is retained until the device is reset and turned back on. After the indication is cleared, however, there is no record of the event until another occurrence has been detected.

It may be advantageous to incorporate arc-fault detection and ground fault detection capabilities into a single, integrated module, thereby reducing consumer costs associated with installing, maintaining, and servicing multiple circuit interrupting devices on a single branch. Furthermore, by combining arc-fault and ground-fault detection functions within a single module, many of the processing functions associated with arc-fault detection such as, for example, electronic fault monitoring, self-test functionality, and fault event data recording, may also be implemented in ground fault detection processes to enhance existing ground fault detection capabilities.

DISCLOSURE OF THE INVENTION

Processes and methods consistent with the disclosed embodiments are directed toward an arc-fault circuit interrupter (AFCI) device that can quickly and effectively discriminate arc-faults from broadband signal sources. Alternatively and/or additionally, the disclosed embodiments may be directed toward a combination AFCI/GFCI device that provides fault detection, mitigation, and reporting of both arc faults and ground faults for an electrical system in a single, integrated module. Additionally, certain disclosed embodiments are directed toward a self-monitoring system and method associated with the AFCI and/or the AFCI/GFCI combination device that enables the device to analyze itself based on predetermined operating criteria. The self-monitoring system may be adapted to provide a health status indication that reports the results of the self-monitoring analysis.

In accordance with one aspect the present disclosure is directed toward a method for detecting arc faults on a power line. The method may include monitoring power signals associated with a power line and filtering the power signals to produce a high frequency signal and a low frequency signal. A mask signal may be generated based on the low frequency signal, and the high frequency signal may be analyzed to extract a broadband portion of the high frequency signal. A fault counter may be incremented if the magnitude of the broadband portion is approximately greater than a first threshold level. A fault counter may be decremented if the magnitude of the broadband portion is approximately less than the first threshold level. A trip signal is provided to a switching device associated with the power line if the fault counter exceeds a predetermined fault limit.

According to another aspect, the present disclosure is directed toward a method for identifying and rejecting non-arc-fault signals associated with a power distribution circuit. The method may include monitoring power signals associated with a power line and filtering the power signals to produce a high frequency signal and a low frequency signal. A mask signal may be generated based on the low frequency signal generating a mask signal and the high frequency signal may be analyzed to extract a broadband portion of the high frequency signal. A number of instances that the broadband portion of the high frequency signal crosses a threshold level may be counted. If the number of instances that the broadband portion crosses the threshold level exceeds a threshold crossing limit, the broadband portion of the high frequency signal may be rejected.

In accordance with yet another aspect, the present disclosure is directed toward a self-test method associated with an arc fault detection device. The method may include performing a processor check, whereby one or more software and/or hardware components associated with a processor are analyzed to determine if the processor is operating within predefined specifications. A status confirmation signal may be provided to a health monitor associated with the microprocessor. If the confirmation signal is not received by the health monitor within an appropriate interval, the processor may be reset. If, after reset, the processor fails to respond, then a trip signal may be generated.

In accordance with yet another aspect, the present disclosure is directed toward a self-test method associated with the arc fault detection device. Once the self-test process has been initiated, RF, AC, ground fault, and differential fault test signals may be generated and delivered to a health monitoring portion of the arc fault detection circuit. Data indicative of outputs associated with one or more components of the arc fault detection circuit may be collected and analyzed based on predefined operational specifications associated with each component. Based on the analysis, a trip signal may be generated and a test fail indicator may be provided if one or more of the components fails to meet the predefined operational specifications.

According to yet another aspect, the present disclosure is directed toward an arc-fault detection system that includes a status notification system for providing signals indicative of the status of the arc-fault detection device. The system includes a housing and a module for detecting arc faults associated with a power distribution system. The module may be disposed substantially within the housing and may provide an optical output signal associated with the status of the module. The system may also include one or more optical waveguide elements communicatively coupled to the module and adapted to receive the optical output signal and route the optical output signal to a surface of the housing. The one or more optical waveguide elements may be composed substantially of non-conductive materials.

In accordance with yet another aspect, the present disclosure is directed toward a series arc fault detection system comprising an ASIC module adapted for coupling to an electrical power circuit and a processor communicatively coupled to the ASIC module. The ASIC module may be configured to receive a broadband portion of a high frequency portion of an electrical signal and synchronize the broadband portion with a mask signal. The mask signal may correspond to a fundamental frequency of a low frequency portion of the electrical signal. ASIC module may also be configured to generate a first threshold crossing signal if the magnitude of the broadband portion is greater than or equal to a first threshold level within a non-zero portion of the mask signal and generate a second threshold crossing signal if the magnitude of the broadband portion is less than the first threshold level within the non-zero portion of the mask signal. The processor may be configured to receive first and second threshold crossing signals from the ASIC module. The processor may increment a fault count value by a first count rate in response to the first threshold crossing signal and decrement the fault count value by a first count rate in response to the second threshold crossing signal. The processor may generate a trip signal if the fault count value exceeds a threshold value.

According to yet another aspect, the present disclosure is directed toward a combination arc fault/ground fault detection system comprising a housing and an analog processing module, a processor communicatively coupled to the analog processing module, a parallel arc fault detection module, and a differential fault detection module, each of which is disposed within the housing. Furthermore, each of analog processing module, parallel arc fault detection module, and differential fault detection module may be adapted for coupling, either directly or indirectly (though one or more other components), to an electrical power circuit. The analog processing module may be configured to receive a broadband portion of a high frequency portion of an electrical signal and synchronize the broadband portion with a mask signal; the mask signal corresponds to a fundamental frequency of a low frequency portion of the electrical signal. The analog processing module may also be configured to generate a first threshold crossing signal if the magnitude of the broadband portion is greater than or equal to a first threshold level within a non-zero portion of the mask signal, and generate a second threshold crossing signal if the magnitude of the broadband portion is less than the first threshold level within the non-zero portion of the mask signal. The processor may be configured to receive first and second threshold crossing signals from the analog processing module. The processor may also be configured to increment a fault count value by a first count rate in response to the first threshold crossing signal and decrement the fault count value by a first count rate in response to the second threshold crossing signal. The processor may generate a series arc fault trip signal if the fault count value exceeds a threshold value. The parallel arc fault detection module may be configured to monitor a current level associated with a low frequency portion of the electrical signal and generate a parallel arc fault trip signal if a magnitude of the current level of the low frequency portion of the electrical signal exceeds a threshold current level. Similarly, the differential fault detection module may be configured to monitor a differential current level between a low frequency portion of the electrical signal associated with a hot line and a neutral line and generate a differential fault trip signal if a magnitude of the differential current level exceeds a threshold differential current level.

In accordance with yet another aspect, the present disclosure is directed toward methods and processes that are configured to detect and interrupt arc fault conditions to potentially mitigate certain effects of these conditions such as fires or property damage. These methods are adapted to not only detect these conditions under a wide range of normal operating scenarios but also effectively avoid shortcomings that may limit existing methods of arc determination such as, for example, false identification of non-arcing conditions as arcing conditions (e.g., power line communication schemes like Homeplug® or other broadband power line (BPL) communication systems), false identification of arcing conditions as non-arcing conditions (e.g., "masking" loads that can sometimes change the characteristics in the line enough to affect the performance the arc detection system), and sudden increases in broadband noise due to certain loads (e.g., "cold" start of dimmer switches, arcing due to commutation of brushes in certain appliances, etc.).

In a further aspect, the present invention is directed to an electrical fault detection device for use in a branch of a power circuit, comprising an AC line current sensor for monitoring the AC current in an electrical distribution line comprising a primary line and neutral line and carrying an AC power signal, wherein the AC line current sensor generates a representative signal proportional to the load current delivered to at least one branch of a power circuit, a line high-frequency sensor coupled to the electrical distribution line for detecting and outputting a broadband high-frequency component of the AC power signal, a differential current sensor coupled to the primary and neutral lines of the electrical distribution line for monitoring the net current between the primary line and neutral line, comparing the net current with the AC load current signal and generating a signal that indicates whether the net line-to-neutral current is inconsistent with a load current by a predetermined acceptable amount, a ground fault current sensor for detecting a current imbalance between the primary and neutral lines of the electrical distribution line, and a signal conditioner in electrical signal communication with the AC current line current sensor, the line high frequency sensor, the differential current sensor and the ground fault current sensor and adapted to generate a signal indicative of the load current associated with a branch of the power circuit. The electrical fault detection device further comprises a sampling circuit for sampling the signal outputted by the signal conditioner and generating a sampled signal, and a processing resource for processing the sampled signal. The processing resource has stored therein data representing a plurality of time-versus-current curves that define a plurality of regions in which tripping may or may not occur, wherein at least one region has time data and current data that define a time duration for a particular current magnitude for which no tripping will occur, and wherein at least one other region has time data and current data that define a time duration for a particular current magnitude for which tripping will occur. The processing resource processes the sampled signal to (i) provide processed time data and current data, (ii) determine the region to which the processed time data and current data correspond, and (iii) generating a signal to initiate tripping if the sampled signal yields time data and current data that corresponds to a region for which tripping must occur.

In yet a related aspect, a method for electrical fault detection comprising monitoring the AC current in an electrical distribution line comprising a primary line and neutral line and carrying an AC power signal, generating a representative signal proportional to the load current delivered to at least one branch of a power circuit, detecting and outputting a broadband high-frequency component of the AC power signal, monitoring the net current between said primary line and neutral line, comparing the net current with the AC load current signal and generating a signal that indicates whether the net line-to-neutral current is inconsistent with a load current by a predetermined acceptable amount, detecting a current imbalance between the primary and neutral lines of the electrical distribution line, and generating a signal indicative of the load current associated with a branch of the power circuit, wherein said signal indicative of the load current is based on (i) said representative signal that is proportional to the load current delivered to at least one branch of a power circuit, (ii) said broadband high-frequency component of the AC power signal, (iii) said signal that indicates whether the net line-to-neutral current is inconsistent with a load current by a predetermined acceptable amount, and (iv) said detected current imbalance between the primary and neutral lines of the electrical distribution line. The method further comprises the steps of sampling the signal indicative of the load current associated with a branch of the power circuit and providing a processing resource having stored therein data representing a plurality of time-versus-current curves that define a plurality of regions in which tripping may or may not occur, wherein at least one region has time data and current data that define a time duration for a particular current magnitude for which no tripping will occur, and wherein at least one other region has time data and current data that define a time duration for a particular current magnitude for which tripping will occur. The method further comprises the step of processing the sampled signal with the processing resource to (i) provide processed time data and current data, (ii) determine the region to which the processed time data and current data correspond, and (iii) generating a signal to initiate tripping if the sampled signal yields time data and current data that corresponds to a region for which tripping must occur.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

The features of the invention that are novel and the elements characteristic of the invention are set forth with particularity in the appended claims. The drawings are for illustration purposes only and are not drawn to scale. Furthermore, like numbers represent like features in the drawings. The invention itself, both as to organization and method of operation, may best be understood by reference to the detailed description which follows taken in conjunction with the accompanying drawings in which:

FIG. 8A illustrates another exemplary RSSI signal associated with an exemplary nuisance signal, generated in accordance with the disclosed embodiments;

FIG. 8B illustrates the RSSI signal of FIG. 8A that has been corrected to compensate for activity that has been detected within the zero-crossing region;

FIG. 8C illustrates the first derivative of the RSSI signal of FIG. 8B, generated in accordance with the disclosed embodiments;

FIG. 8D illustrates an exemplary status of a fault count value based on analysis of the RSSI signal in view of the derivative slope analysis techniques consistent with the disclosed embodiments;

BEST MODE FOR CARRYING OUT THE INVENTION

Reference will now be made in detail to the exemplary embodiments of this disclosure, examples of which are illustrated in the accompanying drawings. Wherever possible, the same reference numbers will be used throughout the drawings to refer to the same or like parts.

Figure 1:
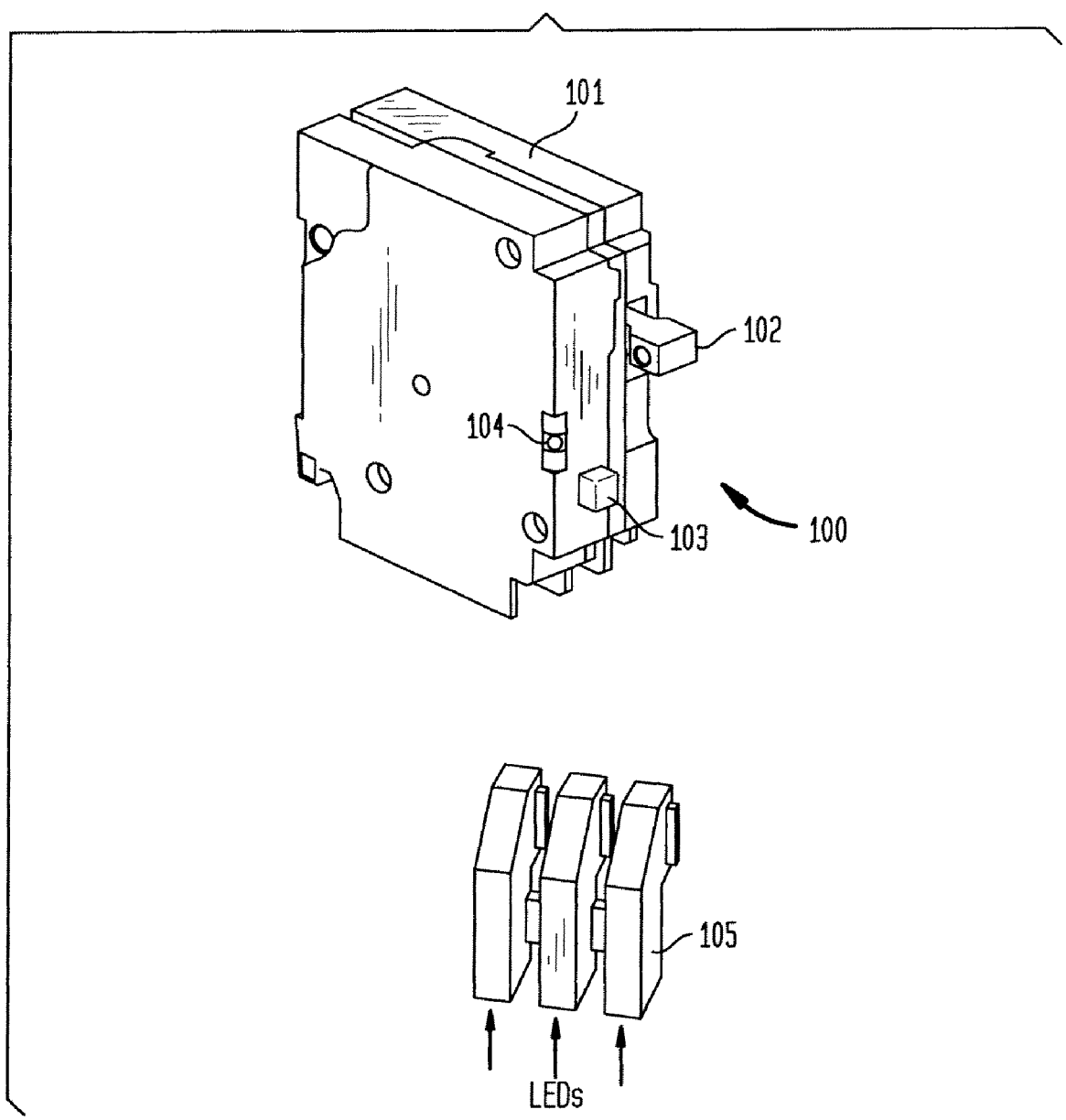
FIG. 1 provides an illustration depicting an exemplary disclosed circuit interrupter device consistent with the disclosed embodiments.

FIG. 1 provides a diagram of an exemplary arc fault circuit interrupting (AFCI) device 100. This device may be adapted for use in any residential and/or commercial power system environment and may be configured to detect arc faults, including both line-fault (i.e., parallel-type arcing between lines) and contact-fault (i.e., series-type arcing on the same line due to electrical discontinuity in the conductor) that may be present on a power circuit associated with the power system. Device 100 may also be configured to detect ground faults occurring on or otherwise associated with a power distribution circuit. It is contemplated that device 100 may include one or more circuits and subsystems for implementing process to detect series and parallel arc-faults, ground faults, and/or differential faults between hot and neutral lines.

As illustrated in FIG. 1, device 100 may include a housing 101 for comprising fault detection circuits and subsystems, an actuator 102 for tripping and/or resetting a circuit interrupting device, a button 103 for manually initiating a self-test process, and a display 104 for outputting status, health, and/or fault information associated with device 100. It is contemplated that device 100 may include additional, different, and/or fewer elements than those listed above. For example, device 100 may include an interface (not shown) adapted to communicatively couple an electronic device (e.g., a diagnostic tool for downloading fault information) to the fault detection circuits and subsystems of device 100. This interface may include any type of electronic interface adapted for transferring information from one electronic system to another such as, for example, a series bus, a parallel bus, a USB or Firewire interface, or any other type of suitable communication interface. This interface may facilitate the upload and download of information (e.g., fault event data, self-test data, software and/or firmware upgrades, software routines, etc.) to and from device 100.

Display 104 may include one or more visual, audio, or audio-visual devices adapted to provide status and/or operational information associated with device 100. According to one embodiment, display 104 may include one or more optical waveguides 105 coupled to LEDs associated with one or more circuits and subsystems of device 100.

Optical waveguides 105 may comprise dielectric material and may be adapted to route LED signals generated by one or more devices within housing 100 to the surface of housing 100 for display to an external user. By utilizing dielectric optical waveguides (instead of bringing the LEDs directly to the surface of the device housing), electrical subsystems and circuits associated with device 100 may be electrically isolated from users, thereby limiting the transfer of electrical charge between the internal electronics of device 100 and a user. As illustrated in FIG. 1, optical waveguides may be configured in any number of shapes and sizes that may be appropriate for routing the light generated by internal LEDs to the surface of housing 100. It is also contemplated that additional or fewer LEDs and/or waveguide devices may be used. Accordingly, the number of display devices shown in FIG. 1 is exemplary only and not intended to be limiting.

It is further contemplated that display 104 may embody different display techniques than those illustrated in FIG. 1. For example, display 104 may embody a numeric, alphanumeric, and/or symbolic LED display adapted to generate a number of different coded indicia for displaying information associated with device 100.

LEDs associated with display 104 may be adapted to display any type of information generated by device 100. For example, LEDs may display a periodic heartbeat signal upon completion of every iteration of one or more self-test processes and microprocessor tests. By providing status signals in this way, LEDs may display a "real-time" indication that the device is functioning according to predetermined specifications. Furthermore, LEDs may be configured to display last known fault conditions upon reset of the device after a fault has been registered (after the restoration of power), thereby providing a the user with a predetermined code corresponding with the type of fault detected (series arc fault, parallel arc fault, etc.), whether the fault resulted from a failed test process, or any other type of information related to the status of device 100.

Device 100 may be electrically coupled to a power distribution circuit and configured to monitor power signals associated with the circuit. Power signal, as the term is used herein, refers to any type of signal that may be present on an electrical circuit. Power signals may include both low frequency and high frequency signals. Non-limiting examples of low-frequency signals include AC current signals that deliver power from a source (e.g., residential power feed) to load, DC power signals, or other types of low frequency signals. Non-limiting examples of high frequency signals include residential alarm system signals; satellite or broadcast (UHF, VHF, AM, FM, etc.) media signals; communication signals; appliance noise; RF, microwave, and millimeter wave signals. In general, for purposes of the present disclosure, high frequency signals refer to any narrowband or broadband signal with at least one frequency component greater than 1 MHz.

Figure 2:
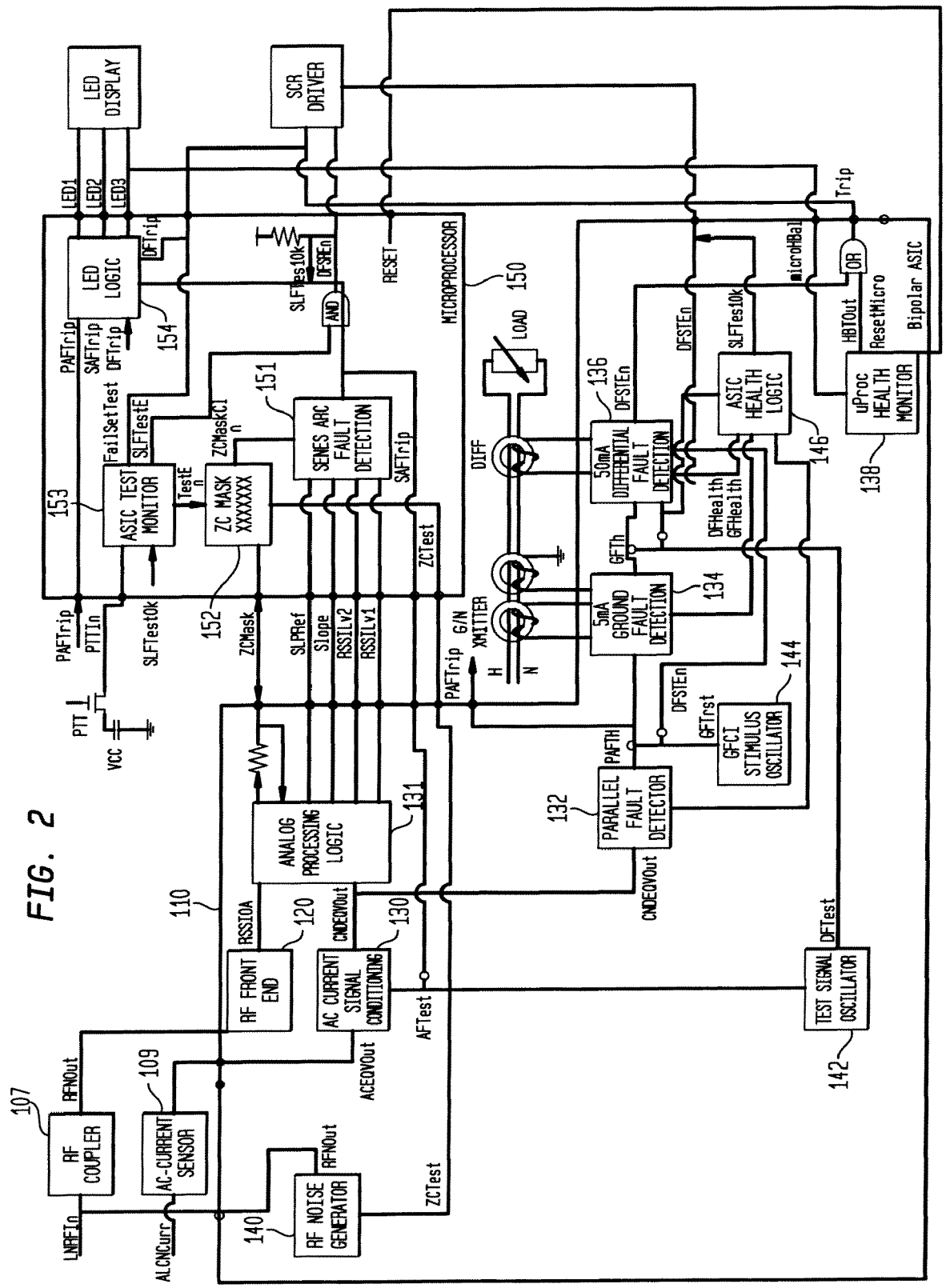
FIG. 2 provides a schematic representation of an exemplary disclosed combination arc fault circuit interrupter/ground fault circuit interrupter device consistent with the disclosed embodiments.

FIG. 2 provides a schematic diagram illustrating exemplary circuit and subsystem configurations associated with device 100. As explained, device 100 may include one or more circuits and subsystems for monitoring electrical signals, identifying fault conditions associated with the electrical signals, actuating a circuit interrupting device to mitigate effects of the fault conditions, and performing one or more self-monitoring functions to ensure appropriate operation of device 100. According to one exemplary embodiment, device 100 may include one or more application specific integrated circuits (ASICs) 110 coupled to a microprocessor 150. It is contemplated that additional, fewer, and/or different components may be associated with device 100. For example, although exemplary embodiments may be described in relation to a combination ASIC/microprocessor system, those skilled in the art will recognize that certain processes and methods may be performed entirely in a microprocessor-based system, eliminating the need for the ASIC circuit. It should be noted, however, that different configurations may not possess the cost benefits realized by an ASIC/microprocessor combination system. Moreover, by including multiple processing devices (e.g., ASIC and microprocessor), the system may support redundant safety features, which may be particularly advantageous in circuit interrupting devices. Furthermore, multiple processing elements may provide test feature(s) wherein one or more processing elements may be adapted to test one or more other processing elements, providing a layer of test redundancy that may not be available in detection schemes that employ only a single processing device.

ASIC 110 may include one or more devices for performing asynchronous (time-independent) operations associated with device 100. For example, ASIC 110 may include devices for preparing or conditioning a signal for synchronous (time dependent) analysis by microprocessor 150. ASIC 110 may include, among other things, an RF front end system 120, an AC current conditioning system 130, analog processing logic 131, a parallel arc fault detection system 132, a ground fault detection system 134, a differential fault detection system 136, and a system 138 for monitoring the health and/or status of microprocessor 150. ASIC 110 may also include one or more circuits or systems adapted for testing one or more portions of device 100 including, for example, an RF noise generator 140, a AC test signal oscillator 142, a ground fault oscillator 144, and a logic system 146 for collecting and processing test signals. ASIC 110 may be communicatively coupled to an RF coupler 107 and an AC current sensor 109, each of which may be adapted to monitor and extract particular portions of power signals collected from one or more electrical power circuits. ASIC 110 may also be communicatively coupled to microprocessor 150 and adapted to communicate data with microprocessor 150 to facilitate execution of processes and functions associated with fault detection in accordance with the methods described herein.

RF coupler 107 may include one or more devices for collecting high frequency data associated with a power circuit. RF coupler 107 may include a high frequency coupling transformer used to collect high-frequency signals from an AC power line. Alternatively, RF coupler 107 may include an RF sensor or transformer that collects and distributes RF signals collected from a signal source. According to one exemplary embodiment, RF coupler 107 may include an E-core or toroidal shape ferrite RF sensor. It is contemplated that RF coupler 107 may include a DC blocking capacitor or high pass filter device that allows the passage of high frequency signals, while rejecting low frequency signals. Furthermore, it is contemplated that although certain exemplary embodiments describe signals as "RF", this term may include other types of high frequency (>1 MHz) signals such as, for example, UHF, VHF, AM, FM, microwave, millimeter-wave, or any other type of high frequency signal.

AC current sensor 109 may include one or more devices adapted to monitor the AC current supplied to a load associated with a power distribution circuit. AC current sensor 109 may include one or more monitoring devices configured to generate a representative signal proportional to the load current delivered to one or more branches of a power circuit. AC current sensor 109 may include a transformer coupled to a power line. Alternatively or additionally, AC current sensor 109 may comprise a metallic strap of known impedance in series with the load that provides an output signal indicative of the current traveling through the line. Optionally, AC current sensor 109 may include a temperature sensor or other temperature compensating device (not shown), adapted to adjust the output signal based on the monitored temperature of the load line.

RF front end system 102 may include any type of receiver adapted to discriminate narrowband RF signals from broadband RF signals. RF front end system 102 may include, for example, a heterodyne or super-heterodyne receiver adapted to receive an RF signal and identify the spectral components of the RF signal at a particular frequency of interest. This may be accomplished by mixing the received RF signal with a predetermined frequency (LO frequency) to identify the one or more signals that include a component substantially at an intermediate (i.e., difference) frequency. In order to identify signals that may have spectral content at different RF frequencies, the LO frequency may be swept, thereby reproducing the spectral content of the RF signal at the fixed intermediate frequency RF front end system 102 may eliminate, filter, and/or reject any portions of the RF signal that outside of the intermediate frequency. As a result, signals that are not substantially broadband may be disqualified by RF front end system 120. RF front end system 120 may be configured to output a received signal strength indication (RSSI) signal indicative of the power of the remaining broadband signal content (i.e., the broadband signals remaining at the intermediate frequency). One exemplary RF front end system is described in U.S. Pat. No. 5,729,145 issued on Mar. 17, 1998 to Blades, which is herein incorporated by reference in its entirety.

AC current conditioning system 130 may include one or more devices adapted to generate a signal indicative of the load current associated with a branch of the power distribution system. For example, AC current conditioning system 130 may include a sensor or transformer adapted to generate a representative signal that is proportional to the low frequency load current. It is also contemplated that AC current conditioning system 130 may be adapted to receive one or more test signals indicative of a simulated load current as part of a self-test process associated with device 100.

Analog processing logic 131 may include one or more logic devices configured to analyze signals provided by RF front end system 120 and AC current signal conditioning system 130. Based on the signal analysis, analog processing logic 131 may generate digital signals appropriate for series arc fault analysis by microprocessor 150.

According to one embodiment, analog processing logic 131 may be adapted to monitor the RSSI signal output by RF front end system 120 and establish, based on the RSSI signal, upper and lower thresholds for use during analysis of the RSSI signal for series arc fault detection. Analog processing logic 131 may be configured to identify the magnitude of the RSSI signal in relation to each of the upper and lower thresholds. For example, analog processing logic 131 may subsequently determine when the magnitude of the RSSI signal is below both a lower and upper threshold level but above a minimum dynamic range level. Similarly, analog processing logic may be configured to determine when the magnitude of the RSSI signal is above a lower threshold level but less than an upper threshold. Additionally, analog processing logic 131 may determine when the magnitude of the RSSI signal is above the upper threshold. Finally, analog processing logic 131 may determine when the magnitude of the RSSI signal is less than a minimum dynamic range level, which indicates that the RSSI level is too low to reliably be detected within the sensitivity range of one or more of the components of analog processing logic 131. Analog processing logic 131 may generate a digital signal unique to each of the RSSI signal conditions described above, and provide the digital signal to microprocessor 150.

Additionally, analog processing logic 131 may also be configured to calculate the first derivative of the RSSI signal and analyze the first derivative of the RSSI signal to determine whether the magnitude of the signal exhibits the time-rate-of-change characteristics associated with a series arc-fault. According to one embodiment, analog processing logic 131 may estimate the first derivative of the RSSI signal by estimating the slope of the RSSI using a least square fit approximation. Analog processing logic 131 may then determine whether, for a particular half-cycle under analysis, the slope associated with the derivative of the RSSI signal meets a slope reference and/or slope threshold levels indicative of a series arc-fault condition. If one or more the above conditions are met, analog processing logic 131 may provide a signal to the microprocessor 150 for further fault analysis.

Analog processing logic 131 may also be adapted to monitor the AC load current and provide signals for tracking the zero crossings associated with the load current. For example, analog processing logic 131 may generate a zero crossing mask signal based on the AC load current. Analog processing logic 131 may analyze a signal representative of the AC load current from the line to generate a square wave mask signal depicting "inside zero-crossing" and "outside zero-crossing" regions. The mask signal is assigned a low logic state (e.g., logic "0") during transition of the sinusoidal AC signal from positive amplitude to negative amplitude. Similarly the mask signal is assigned a high logic state (e.g., logic "1") when the AC load current is out of this region. The zero-crossing region can be defined as a time-bound region (or referenced) around the time where the AC load current value is zero.

Because parallel arcing may be generally characterized by interruptions in load current followed by sudden and dramatic increases in line current, parallel arc fault detection system 132 may be adapted to identify these characteristics on a power distribution circuit. Furthermore, because these types of faults often result from random electrical arcing between proximal conductors (as opposed to direct line contact) their duration may be sufficiently short so as to prohibit their identification by conventional circuit breaker technology. Accordingly, there is a need to quickly identify and mitigate these types of arcs in order to prevent persistent arcing.

Accordingly, parallel arc fault detection system 132 may be configured to detect arcs associated with line-neutral or line-ground faults that are typically short enough in duration so as not to trip a conventional circuit breaker. Parallel arc fault detection system may be adapted to detect rapid increases in current amplitude and trip within a few half-cycles of detecting the condition. Parallel arc fault detection system 132 may include, among other things, an AC current conditioning circuit (not shown), a temperature sensor or temperature compensation device (not shown), a threshold level control circuit (not shown), an arc fault discriminating circuit (not shown), a large signal event detector (not shown), and a differential fault level discriminating circuit (not shown).

An AC current conditioning circuit may include an amplifier and a full-wave rectification circuit configured to prepare the AC current for half-wave analysis by the parallel arc fault detection system 132.

The temperature sensor (or temperature compensation device) and threshold level control circuit may cooperate to adjust the one or more threshold levels based on temperature of the line. Those skilled in the art will recognize that, because resistivity increases as temperature of the conductor increases, the current detected by the current sensor may be lower than the actual current flowing through the conductor (due to the sensor's calibration to "nominal" conditions). Accordingly, the threshold level control circuit may automatically adjust the parallel threshold trip level to compensate for line temperature determined by the temperature sensor.

Arc fault discriminating circuit, large signal event detector, and differential fault level discriminating circuit may cooperate to provide an adaptive system that monitors line current and determines if the current exceeds a trip threshold for a predetermined amount of time (which may be established based on the current level). If the current exceeds a trip threshold level for the predetermined time period, a trip signal may be generated and transmitted to microprocessor 150 affecting an interruption in the electrical circuit. If the circuit interrupter is subsequently reset, the type of fault condition will be displayed on LED devices without impacting normal operation of the device.

Alternatively, if the current exceeds a trip threshold, but does not maintain the current level for the duration required to initiate a trip event, the event may be recorded. If the event is persistent, one or more threshold levels may be adjusted to lower the threshold required to prompt an interruption in the circuit. A status indication may be provided to notify the user that a potentially troublesome condition may exist on the circuit, although the fault conditions may not have been met.

Figure 2A:
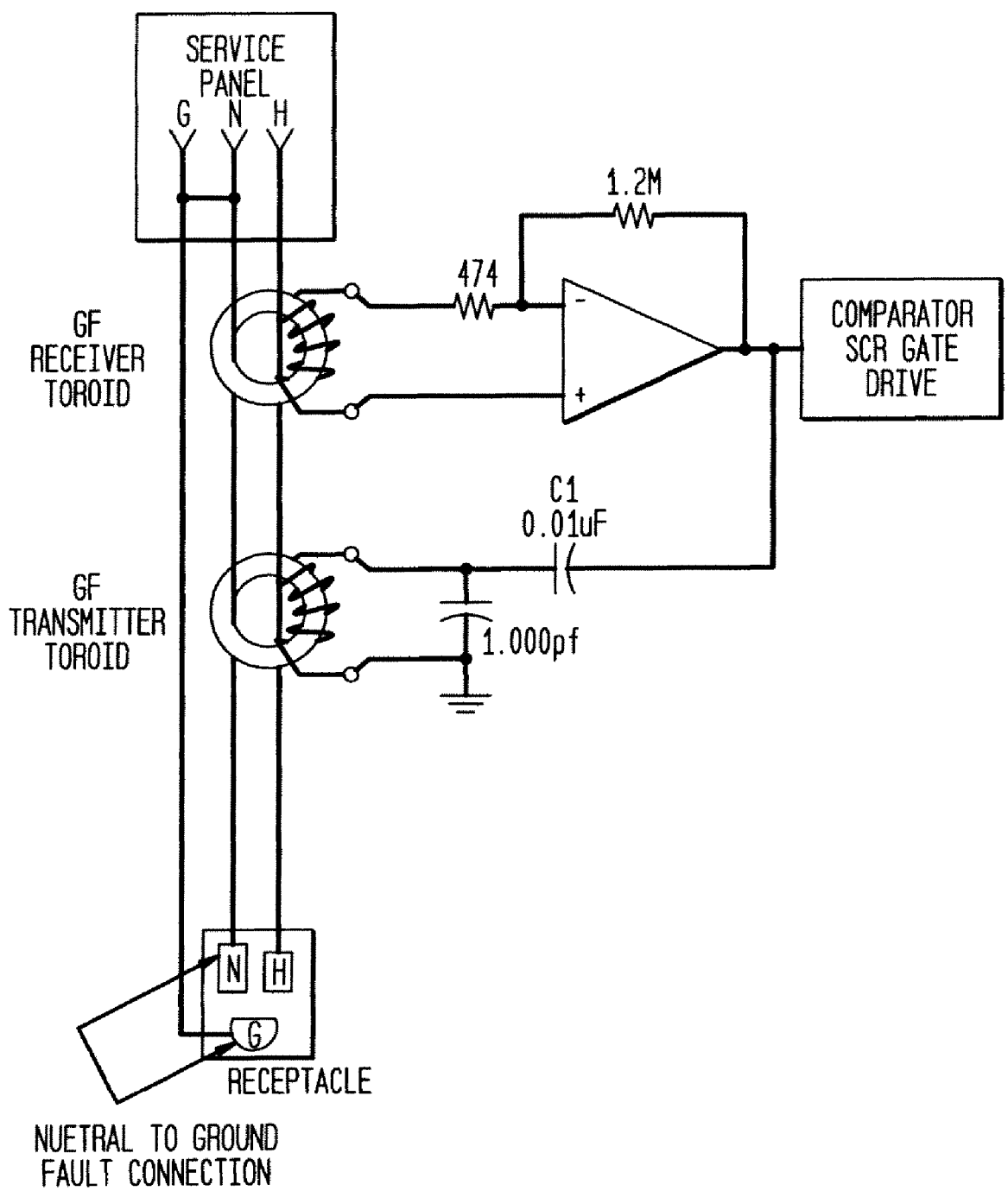
FIG. 2A provides a schematic representation of an exemplary disclosed ground fault detection circuit used in a fault circuit interrupter device consistent with the disclosed embodiments.

Ground fault detection system 134 may include a grounded neutral transmitter sensor and a ground fault receiver sensor. These sensors may be toroid-type current sensing devices that monitor both line and neutral conductors. A grounded neutral fault condition forms a magnetic path that passes thru the grounded neutral toroid. This allows the grounded neutral toroid to induce an oscillatory wave on both the line and neutral conductor. However, induced current can only flow in the neutral wire due to the grounded neutral fault path. The current imbalance between the line and neutral wires is sensed by the differential ground fault toroid. In response to this current imbalance, a ground fault trip signal may be provided to the breaker trip circuit (e.g., SCR driver). An exemplary embodiment of the ground fault detection system is illustrated in FIG. 2A.

Differential fault detection system 136 may be adapted to monitor the net current between a primary line and a neutral line, and compare the net current with the AC load current signal. If the comparison indicates that the difference between the net line-to-neutral current is inconsistent with a load current by a predetermined acceptable amount (which may be indicative of current leakage in the distribution system), a differential fault may be detected and a trip signal may be generated.

Those skilled in the art will recognize that ground fault detected system and differential fault detection system may be combined in a single unit. Alternatively, in certain situations where ground fault protection is not required or desired by a user, ground fault protection system 134 may be disconnected or disabled (e.g., via a selector switch (not shown)).

Health monitoring system 138 may embody any device adapted to periodically receive a status indication from microprocessor 150 and generate a response if the status indication is inconsistent with a predetermined status. The status indication may include, for example, a heartbeat signal that is provided by the microprocessor at predetermined intervals. Each heartbeat signal may indicate that systems associated with microprocessor 150 have "checked in" and are fully operational. If the status indication is either delayed or not received by system 138 in accordance with a predetermined schedule, system 138 may reset microprocessor 150. If the problem persists, system 138 may generate a trip signal and record a trouble code indicative of the presence of a potential microprocessor error.

Microprocessor 150 may include one or more devices adapted to receive processed data signals associated with the high and low frequency analysis performed by ASIC 110 and analyze the data to identify the presence of one or more series arc fault conditions. As illustrated in FIG. 2, microprocessor 150 may include a series arc fault detection system 151, zero crossing (ZC) mask debouncing circuit 152, an ASIC test monitor circuit 153, and an LED logic circuit 154.

Series arc fault detection system 151 may be adapted to receive a plurality of digital signals from ASIC 110 and analyze these signals to determine the presence of series arc faults in the line. According to one exemplary embodiment, series arc fault detection system 151 may compare the received signals with a mask signal indicative of a square wave corresponding to the load current. Based on the comparison, series arc fault detection system 151 may identify and filter (or otherwise disqualify) signals that do not correspond with series arc fault signals. Once potential series arc fault signals have been isolated, series arc fault detection system 151 may employ a weighted counting function to identify series arc faults from among broadband noise signals.

ZC mask debouncing circuit 152 may be adapted to receive a ZC mask signal from ASIC 110 and filter or smooth noise associated with the mask signal. For example, ZC mask debouncing circuit 152 may include one or more filters for removing superfluous and/or abnormal frequency components from the mask signal. Alternatively and/or additionally, ZC mask debouncing circuit 152 may include an exponential smoother or averaging algorithm adapted to remove any electrical "jitter" or noise that may have been injected into the signal. Additional and/or different components than those listed above may be employed to filter noise from and/or smooth the mask signal.

ASIC test monitor 153 may be configured to initiate, monitor, and record results associated with an ASIC test conducted by microprocessor 150. For example, microprocessor 150 may conduct a test of ASIC 110 to determine whether ASIC 110 is operating in accordance with predetermined system parameters. ASIC test monitor 153 may also be adapted to monitor and record the test results, initiate ASIC tests, and temporarily suppress arc fault detection operations associated with device 100 while a test is in progress (to prevent the tripping of the device as a result of a test sequence).

LED logic 154 may include one or more devices for displaying status codes associated with device 110. It is contemplated that, although certain embodiments illustrate output logic as an LED-based coding system, additional and/or different methods of status notification may be implemented such as, for example, audio and/or a combination of audio and visual notification signals. As explained, display 104 may be configured to route signals generated by LED logic 154 to a surface of housing 110 associated with device 100.

Microprocessor 150 may include one or more memory devices for storing information associated with device 100. Memory devices may include any type of memory device suitable for the storage of data associated with operations of device 100. For example, microprocessor 150 may include one or more data registers for storing data indicative of the status of device 100. According to one embodiment, microprocessor 150 may be adapted to store fault-related information instantaneously, in the event of a detected fault. Because microprocessor 150 can store status information in a manner of microseconds during the time required for an actuator associated with device 100 to interrupt the circuit (typically milliseconds), those skilled in the art will recognize that microprocessor 150 can store the status information at the time of the trip, without unnecessarily delaying a trip condition to store the information.

According to one exemplary embodiment, microprocessor 150 may include one or more flash memory devices (not shown) for storing fault codes and/or device status information. The flash memory devices may store the information for a predetermined time period (e.g., 30 days, 60 days, etc.) or until the device is reset, whichever is later. Microprocessor 150 may display the information via display 104 once power is restored to the device. Alternatively or additionally, microprocessor 150 may be powered by a battery or other backup power supply. Accordingly, microprocessor 150 may display fault codes stored in flash memory, even in the absence of a power connection to the electrical power circuit.

SCR driver 160 may be configured to detect the presence of one or more trip signals and actuate a switching device to interrupt the circuit connection between the power supply and the load. For example, SCR driver 160 may be communicatively coupled to each of series arc fault detection system 151, parallel arc fault detection system 132, ground fault detection system 134, differential fault detection system 136, health monitoring system 146, and/or microprocessor 150. SCR driver may detect fault signals from each of these systems and operate a switch that interrupts the circuit connection between the power supply and the load, thereby mitigating fault and fault-like conditions.

Processes and methods consistent with the disclosed embodiments provide an arc fault circuit interrupting device that can identify arc faults present in a power distributions system, while minimizing nuisance trips associated with signals that closely resemble the arc fault conditions. These processes may include methods for establishing an arc fault count system, whereby a received signal is monitored and compared with an ideal arc fault signal (e.g., mask signal). The fault count system may increment during periods of strong correlation between the ideal signal and the received signal, and may decrement during periods of low correlation. A trip signal may be generated if the fault count level exceeds a predetermined fault threshold.

Figure 3:
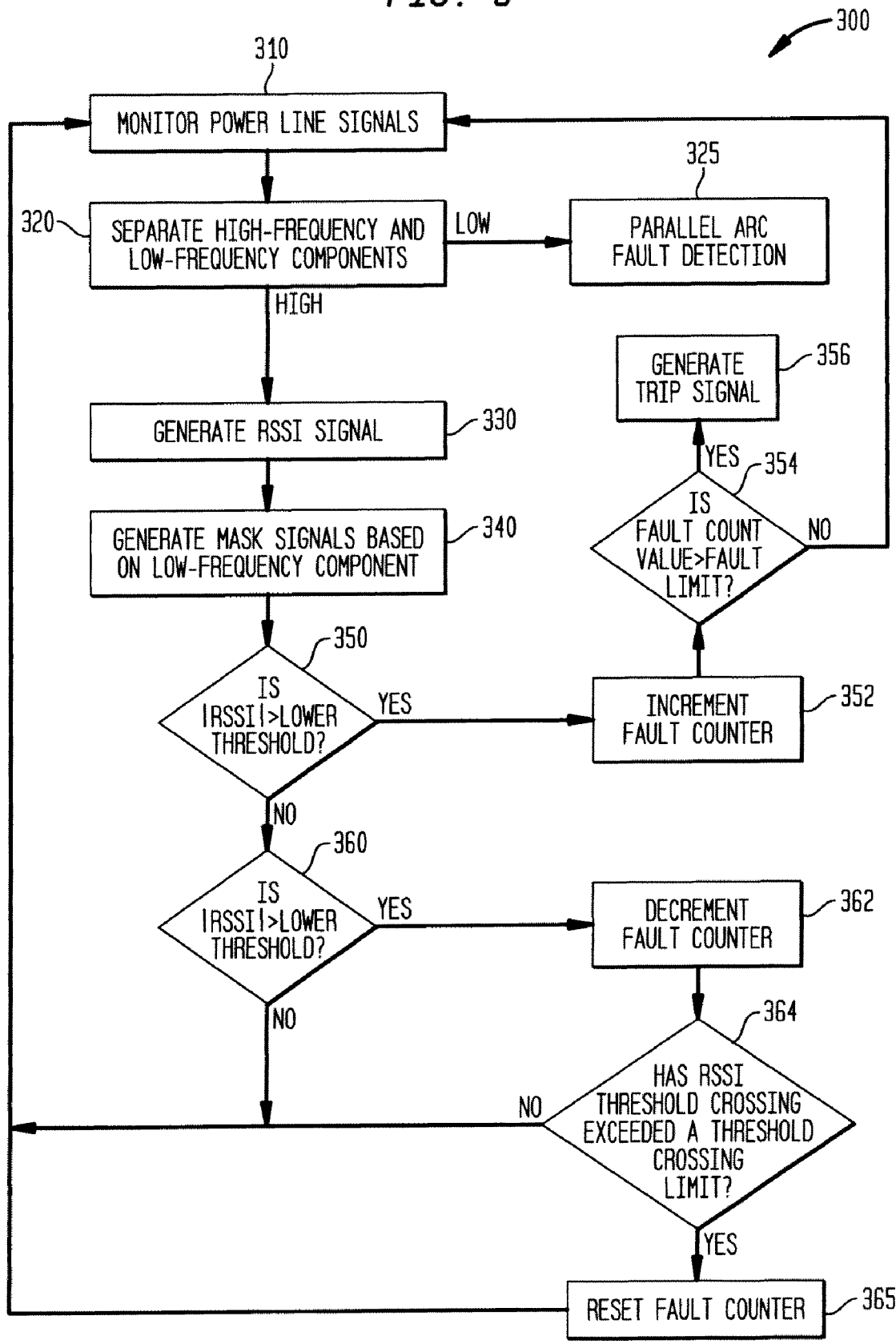
FIG. 3 provides a flowchart depicting an exemplary disclosed series arc fault detection method consistent with the disclosed embodiments that may be implemented by the device of FIG. 2.

FIG. 3 provides a flowchart 300 illustrating an exemplary method of operation associated with device 100 in accordance with certain disclosed embodiments. As illustrated in FIG. 3, device 100 may monitor power line signals associated with a power circuit with which device 100 may be connected (Step 310).

Device 100 may separate the high-frequency and low-frequency components of the monitored power line signals (Step 320). For example, device 100 may include a high-pass and a low-pass filter electrically coupled to the power line. The high pass filter may be selected with a cutoff frequency substantially higher than 60 Hz (e.g., 1 MHz), while the low pass filter may be selected with a cutoff frequency slightly higher than 60 Hz (e.g., 90 Hz). Low pass signals may be passed to a portion of device 100 adapted to determine the presence of parallel arc fault conditions (Step 325).

Device 100 may analyze the high frequency signal, identify and reject one or more portions of the high-frequency signal that are narrowband, and generate a received signal strength indication (RSSI) signal (Step 330). For example, as explained, RF front end 120 may include a heterodyne receiver adapted to tune narrowband signals to an intermediate frequency. The narrowband signals may be identified by significant spectral energy at one or more discrete frequencies, with little or no frequency component outside of those discrete frequencies. Accordingly, these narrowband signals may be rejected by device 100, allowing the passage of only broadband signals for further analysis. These broadband signals may include portions of the high frequency signal that contain spectral content similar to that of series are faults.

Device 100 may be adapted to generate upper and lower threshold levels associated with each RSSI signal that is generated, based on the RSSI signal amplitude. For instance, device 100 may establish a lower threshold level at a lower percentage (e.g., 25%) of the magnitude of the RSSI signal. This lower threshold level may be determined as an optimum level appropriate for distinguishing large dips associated with non-arcing or nuisance signals from random perturbations associated with arc fault signals. According to one exemplary embodiment, the lower threshold level may be established at approximately 25% of a respective RSSI signal.

Similarly, device 100 may establish an upper threshold level at a percentage of the magnitude of the RSSI signal (e.g., 62.5%). This upper threshold level may be determined as an optimum level appropriate for distinguishing relatively small dips associated with non-arcing or nuisance signals from random perturbations associated with arc fault signals, as is the case with the lower threshold level. However, the upper threshold may be established to distinguish variations in RSSI signals that may be small enough in magnitude so as not to "trigger" the lower threshold level.

Device 100 may generate a mask signal, based on the low frequency component of a power line signal (Step 340). The mask signal may include, for example, a square wave signal corresponding to a load current signal, where portions of the signal within a predetermined range of the zero crossing are assigned a mask value of logic "0", while portions of the signal outside the predetermined range of the zero crossing may be assigned a mask value of logic "1". As those skilled in the art will recognize, the resulting mask signal will include a rectified square wave corresponding to the load current. The zero crossing regions associated with the mask value may be used to reject nuisance signals, as true arc faults are synchronous with the fundamental frequency (e.g., 60 Hz) of the electric circuit. Thus, signals that have large amounts of spectral content within the zero-crossing region are asynchronous with the fundamental frequency and may be disqualified as potential arc-fault activity.

Device 100 may compare the RSSI signal with one or more threshold levels within the "outside" zero crossing region of the mask signal (i.e., the portion of the mask signal associated with logic "1"). While the RSSI signal exceeds a lower threshold level (Step 350: Yes), device 100 may increment a fault count value associated with microprocessor 150 (Step 352) by a first count rate. If a fault count value stored in the fault counter exceeds a predetermined fault limit (Step 354; Yes) a trip signal may be generated to actuate a circuit interrupting device (Step 356). Alternatively, if the fault count value does not exceed the fault limit (Step 354: No), device 100 may return to step 310 and continue monitoring the power distribution circuit.

While the RSSI signal is less than the lower threshold (Step 360: Yes), device 100 may decrement a fault counter associated with microprocessor 150 (Step 362) by a first count rate.

In addition to monitoring the time that the magnitude of the RSSI signal is above a minimum threshold, microprocessor 150 may monitor the number of times that the magnitude of the RSSI signal crosses the upper and lower thresholds. Specifically, microprocessor 150 may count the RSSI threshold crossings (either or both of upper and lower threshold crossings) and reset the fault counters if the threshold crossing(s) exceed a predetermined threshold crossing limit (Step 364).

To disqualify nuisance signals, device 100 may compare the number of threshold crossings with predetermined crossing limits for each of the upper and lower threshold crossings. If the number of upper threshold crossings exceeds a limit for the number of upper threshold crossings, device 100 may reset the fault counter to a default value (e.g., zero). Similarly, if the number of lower threshold crossings exceeds a limit for the number of lower threshold crossings, device 100 may reset the fault counter to the default value. Because the amplitude fluctuation required to cross the upper threshold level is substantially less than the amplitude fluctuation required to cross the lower threshold level, the crossing limit associated with the upper threshold level may be higher that the crossing limit for the lower threshold level.

Figure 4:
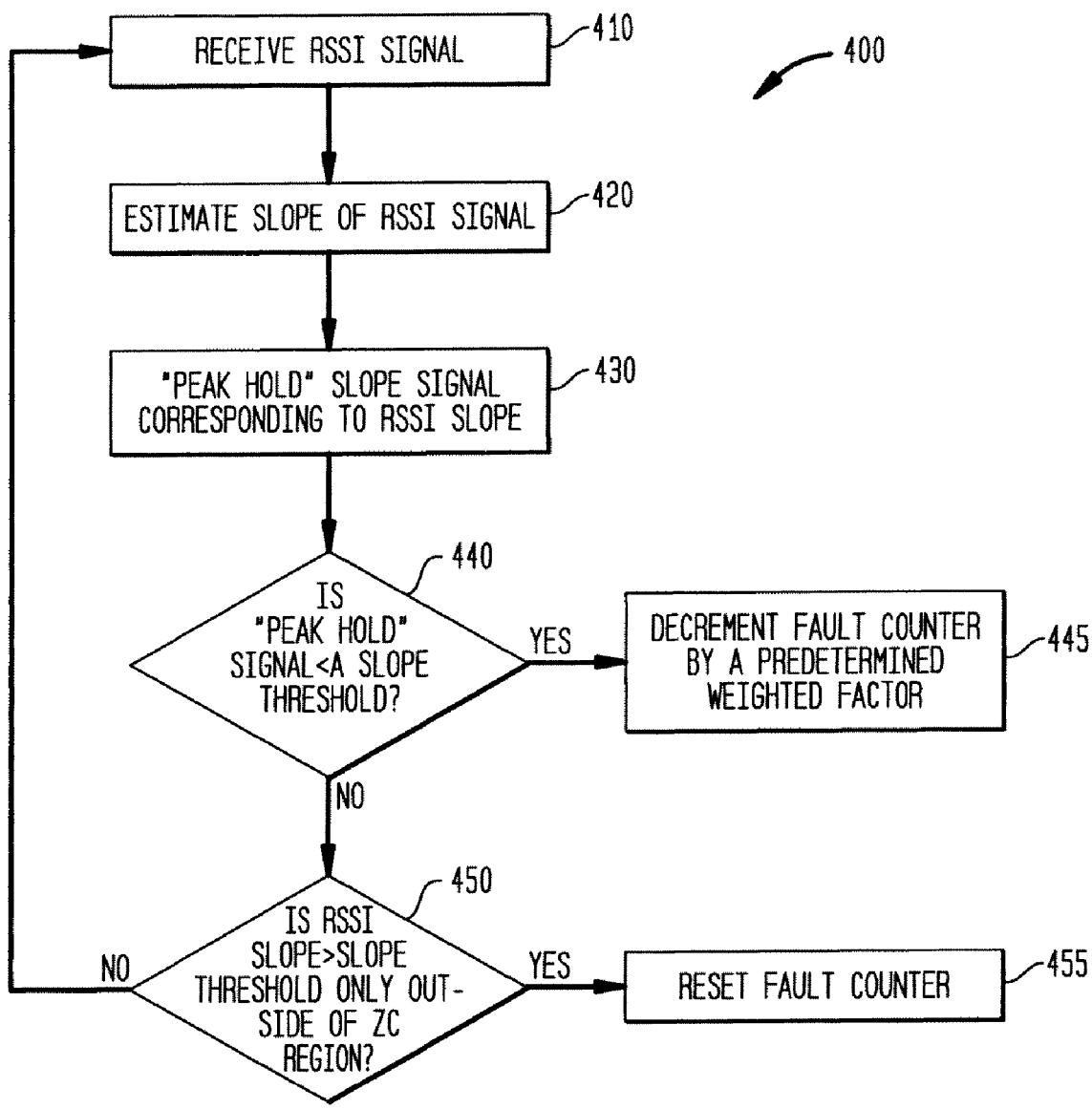
FIG. 4 provides a flowchart depicting an exemplary disclosed series arc fault detection method using slope analysis consistent with the disclosed embodiments.

Typically, arc fault signals may be characterized by rapid, extreme changes in amplitude of the RSSI signal. These types of signals may be distinguished from broadband noise and other nuisance signals, which generally exhibit more gradual and/or predictable behavior. Accordingly, nuisance signals may be identified and/or rejected by analyzing the slope (i.e., the rate of change of amplitude over a period of time) and comparing the analyzed slope to a predetermined slope threshold. FIG. 4 provides a flowchart 400 illustrating an exemplary method for analyzing the slope of the RSSI signal and rejecting nuisance signals based on the analysis.

As illustrated in FIG. 4, processor 150 may receive signals indicative of an RSSI signal (Step 410) from ASIC 110 and estimate the slope of the RSSI signal (Step 420). The slope may be estimated by calculating the first derivative of the RSSI signal with respect to time. Alternatively and/or additionally, the slope may be approximated using a least square fit method or some other slope approximation technique.

Device 100 may employ a "peak hold" function to capture peaks of the RSSI slope signal (Step 430). Ideally, the peak associated with an arc fault signal for a particular half-cycle will occur at or near the rising edge of the mask signal. If the "peak hold" slope signal is less than a slope threshold (Step 440: Yes) (indicating that the RSSI signal is not likely indicative of a fault condition) microprocessor 150 may decrement the fault counter by a second count rate (Step 445), which may be greater than the first count rate employed when the RSSI signal is below the lower threshold, thereby penalizing those signals that do not correlate closely with arc fault slope characteristics. Alternatively, if the "peak hold" signal is greater than the slope threshold (Step 440: No) at or near the beginning of the outside zero crossing region, microprocessor 150 may increment the fault counter at the normal rate (indicating the signal correlates with an arc-fault condition at that time period.)

Alternatively and/or additionally, if the RSSI slope is greater than the slope threshold only outside the zero crossing region (i.e., not at or near the zero crossing region) (Step 450: Yes) microprocessor 150 may reset the fault counter to a predetermined value (e.g., zero). Because series arc fault typically have RSSI slope peaks at or near the zero-crossing region, RSSI slope peaks that are detected later in the outside zero crossing region and exceed the initial RSSI peak at or near the zero crossing region may indicative of a nuisance signal. As such, microprocessor 150 may zero the fault count value, essentially rejecting the signal as a non-arc signal.

Figure 5A:
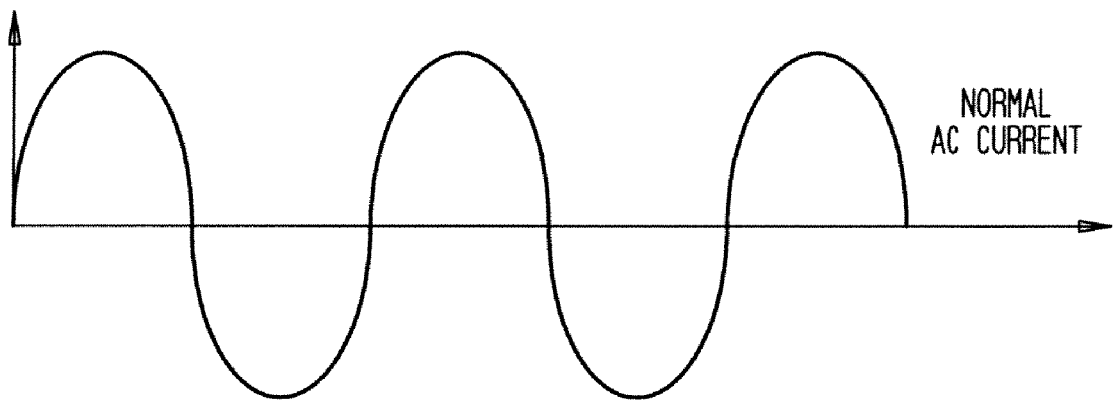
FIG. 5A illustrates a normal AC current signal that may be associated with an electrical power circuit.
Figure 5B:
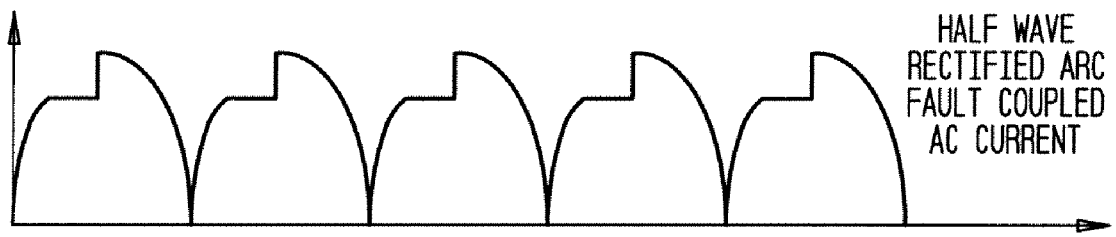
FIG. 5B illustrates an exemplary AC current signal that includes an arc-fault or arc-fault like activity.
Figure 5C:
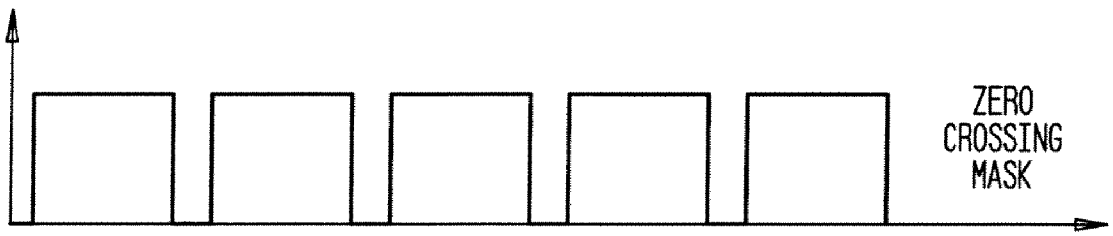
FIG. 5C illustrates a zero crossing mask signal that may be used to analyze the presence of series arc-fault activity present on an electrical power circuit.

FIGS. 5-7 provide graphs that illustrate, by way of signal analysis, exemplary processes consistent with the disclosed embodiments. For example, FIG. 5 illustrates an exemplary process for generating mask signals based an AC load current. For reference, FIG. 5A illustrates an exemplary ideal AC load signal. In contrast, FIG. 5B illustrates and half-wave rectified arc-fault-coupled AC load signal. As previously explained, this signal may be processed by analog processing logic 131 to produce a zero crossing mask signal, illustrated in FIG. 5C, characterized by respective inside (corresponding with logic "0") and outside (corresponding with logic "1") zero crossing regions.

Figure 6A:
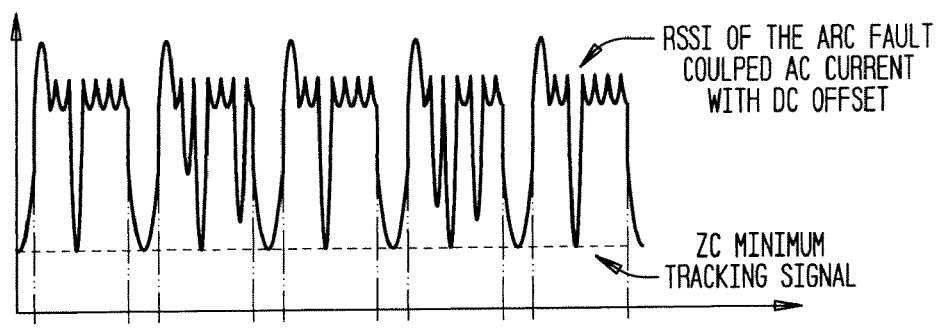
FIG. 6A illustrates an exemplary RSSI signal associated with an exemplary series arc-fault condition, generated in accordance with the disclosed embodiments.
Figure 6B:
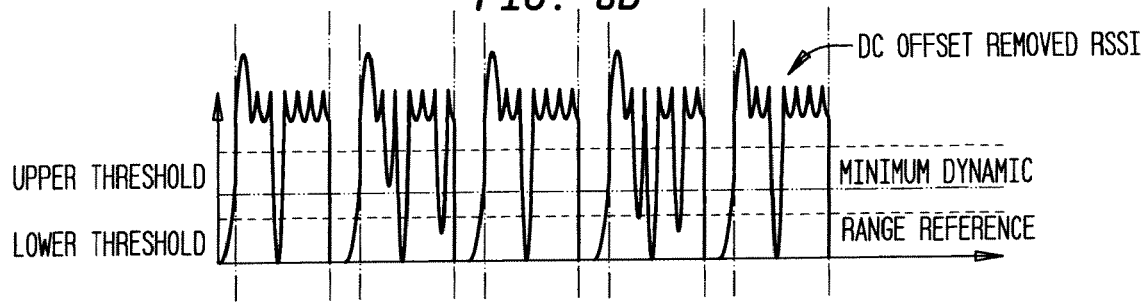
FIG. 6B illustrates the RSSI signal of FIG. 6A that has been corrected to compensate for activity that has been detected within the zero-crossing region.

FIG. 6 illustrates a count method associated with an exemplary arc-fault signal. First, FIG. 6A illustrates an RSSI signal generated by analog processing logic 131 of device 100. The RSSI signal may contain a DC offset that can be corrected by subtracting the amplitude of the mask signal in the outside zero crossing region from peak amplitude of the RSSI signal. The resulting "DC offset-corrected" RSSI signal is illustrated in FIG. 6B.

Figure 6C:
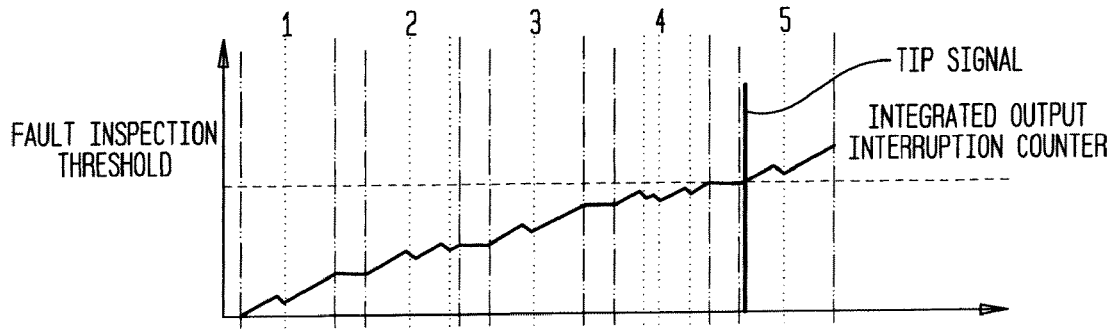
FIG. 6C illustrates an exemplary status of a fault count value based on analysis of the corrected RSSI signal of FIG. 6B.

Once the RSSI signal has been corrected, the signal may be compared with the lower threshold level, the results of such comparison may be recorded by a fault counter. The status of the fault counter associated with the analysis of FIG. 6B is illustrated in FIG. 6C. For example, while the peak amplitude of the RSSI signal exceeds the lower threshold level, a fault counter may be incremented. Similarly, while the peak amplitude of the RSSI signal is below the lower threshold level, the fault counter may be decremented. When the fault counter reaches a fault level threshold, as in the fifth half-cycle of the RSSI signal frame, a trip signal may be generated, thereby initiating a fault sequence. It should be noted that, in certain situations, the rate at which the fault counts are incremented and/or decremented by may be adjusted (e.g., weighted) to give preference or to penalize certain conditions more severely. Thus, if the RSSI does not increase in amplitude at the rising edge of the zero crossing region (indicating the increased likelihood that the signal is not a series arc fault), the fault counter may be decremented at twice the normal rate.

Figure 7A:
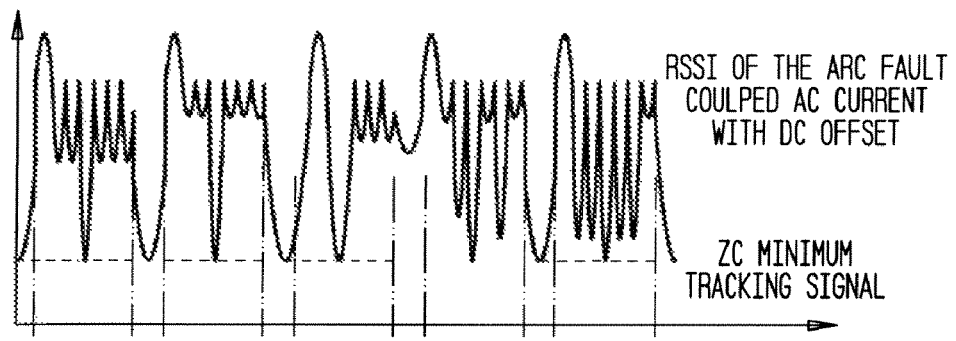
FIG. 7A illustrates an exemplary RSSI signal associated with an exemplary nuisance signal, generated in accordance with the disclosed embodiments.
Figure 7B:
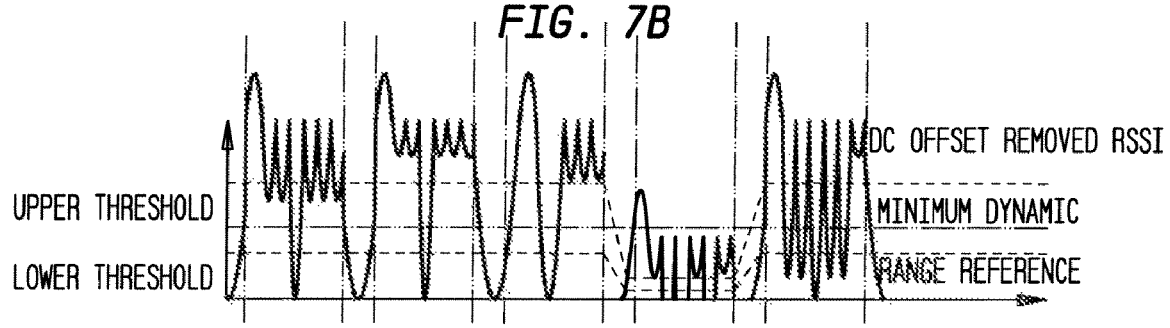
FIG. 7B illustrates the RSSI signal of FIG. 7A that has been corrected to compensate for activity that has been detected within the zero-crossing region.
Figure 7C:
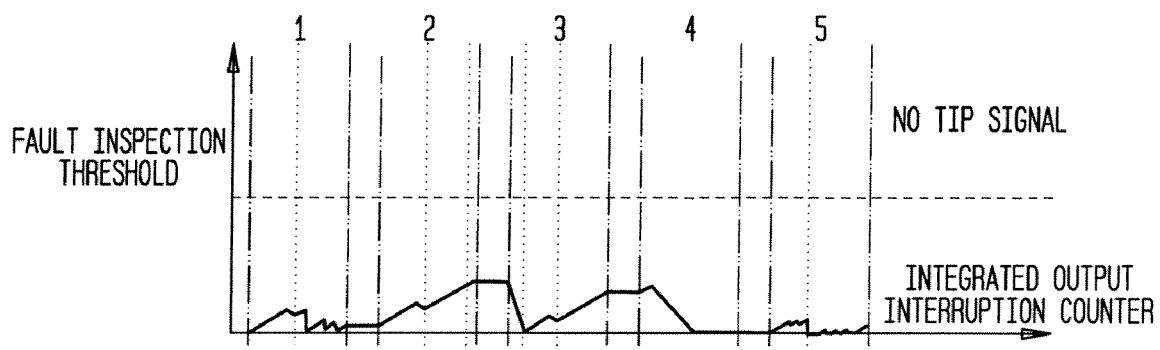
FIG. 7C illustrates an exemplary status of a fault count value based on analysis of the corrected RSSI signal of FIG. 7B.

FIGS. 7A-7C illustrate an exemplary situation where the presently disclosed count method properly discriminates a nuisance signal. FIG. 7A illustrates an RSSI generated by analog processing logic 131 in accordance with the disclosed embodiments. The RSSI signal may be corrected using the DC offset and/or mask signal tracking features described above. The resulting DC offset-corrected signal is illustrated in FIG. 7B.

FIG. 7C illustrates an exemplary status of a fault count value based on analysis of the corrected RSSI signal of FIG. 7B. This example includes several conditions that indicate that the monitored signal does not constitute an arc fault signal. For example, in analyzing the first half-cycle of FIG. 7B, microprocessor 150 properly increments the timer when the magnitude of the RSSI signal exceeds the lower threshold. Halfway through the first half-cycle, microprocessor 150 decrements the fault counter corresponding to the temporary decline in the magnitude of the RSSI below the lower threshold level. When the magnitude of the RSSI signal returns to above the lower threshold, microprocessor 150 begins to increment the fault counter, as expected. Shortly thereafter, microprocessor resets the value of the fault counter to zero, which corresponds with the 10.sup.th crossing of the upper threshold by the magnitude of the RSSI signal, which (in this embodiment) exceeds the upper threshold crossing limit set in the microprocessor 150.

Moving now to the second half-cycle of FIG. 7B, microprocessor 150 properly increments and decrements the fault counter corresponding to the status of the magnitude of the RSSI signal with the lower threshold. Unlike the portion of the signal associated with the first half-cycle, the magnitude of the RSSI signal only crosses the upper (and lower) threshold levels twice, substantially less than the ten threshold crossings that are required to reset the fault count value.

Moving now to the third half-cycle, because the magnitude of the RSSI fails to exceed the upper threshold level substantially during the zero crossing, microprocessor 150 correctly identified the signal as substantially non-conforming, as a strong characteristic of series arc-fault signals is their rapid increase in RF energy at or near the zero crossing region. Accordingly, microprocessor 150 decrements the fault count value at an increased count rate, additionally penalizing this signal for the failure to meet this characteristic of series arc-fault. For the remaining portion of the half-cycle, microprocessor 150 increments and decrements the fault count value, as expected, based on the upper and lower threshold crossings.

Continuing with the analysis of the forth half-cycle of the RSSI signal of FIG. 7B, because the zero crossing region preceding the fourth half-cycle includes a significant amount of RF energy inside the zero crossing region (see FIG. 7A), indicating the high likelihood that the RSSI signal within the fourth zero crossing region is supplemented by asynchronous (nuisance-type) activity. Accordingly, when generating the corrected RSSI signal of FIG. 7B, the magnitude of the "noise" inside the zero-crossing region is removed from the corrected RSSI signal outside the zero-crossing region. The threshold levels are re-calculated for this portion of the half-cycle. As illustrated in FIG. 7C, microprocessor 150 correctly increments the fault count value initially, when the magnitude of the RSSI signal exceeds the lower threshold level. However, once the signal falls below the minimum dynamic range reference (although greater than the lower threshold level), microprocessor 150 decrements the fault count value, as RSSI signals with upper thresholds less than the minimum dynamic range are indicative of non arc-fault type activity.

Moving now to the fifth half-crossing, microprocessor 150 properly increments and decrements the fault count value consistent with the status of the magnitude of the RSSI signal compared to the lower threshold. Toward the middle of the half-crossing, microprocessor resets the value of the fault counter to zero, which corresponds with the 6.sup.th crossing of the lower threshold by the magnitude of the RSSI signal, corresponding to the lower threshold crossing limit set in the microprocessor 150. Accordingly, each subsequent lower threshold crossing during the fifth half-cycle resets the fault count value.

In addition to determining the presence of a series arc-fault by monitoring the RSSI signal, device 100 may be configured to monitor the first derivative of the RSSI signal to further aid in discriminating between series arc-fault conditions and nuisance signals.

FIGS. 8A-8D illustrate an exemplary scenario, where slope of the RSSI signal can further aid in distinguishing between series arc faults and nuisance signals. FIG. 8A illustrates an RSSI generated by analog processing logic 131 in accordance with the disclosed embodiments. The RSSI signal may be corrected using the DC offset and/or mask signal tracking features described above. The resulting DC offset-corrected signal is illustrated in FIG. 8B.

FIG. 8C illustrates the slope of the RSSI signal as determined by microprocessor 150 using an 8-sample least square fit approximation. A peak hold function may also be used to determine a slope reference level associated with a particular half-cycle under investigation.

Microprocessor 150 may first analyze the RSSI signal to determine whether to increment or decrement the fault counter based on the magnitude of the RSSI signal in comparison with the lower threshold, as described in connection with the analysis of FIGS. 7A-7C. As a secondary measure, microprocessor 150 may then analyze the slope of the RSSI signal to determine any additional actions that may be required to "correct" the analysis of the RSSI signal. One reason for this is that series arc-fault activity is generally characterized as having a maximum time-rate-of-change for a half-cycle at (or substantially near) the zero-crossing region. Accordingly, slope of the RSSI signal may provide a simple method for identifying the maximum time-rate-of change of the amplitude of the RSSI signal. If the time rate of change of amplitude of the RSSI signal is not a maximum for a particular half-cycle at or near the zero-crossing region, the fault count value may be decremented.

For example, as illustrated in FIG. 8D, in analyzing the first half-cycle of the RSSI signal, microprocessor 150 may properly increment the fault count value, as the magnitude of the RSSI signal is above the lower threshold and the initial slope of the RSSI signal is at an initial maximum value. However, the fault count value is subsequently reset because the slope of the RSSI is at a maximum substantially later than the zero-crossing region. Microprocessor 150 may continue incrementing and decrementing the fault count value thereafter, consistent with principles previously illustrated. For example, later in the first half-cycle, the fault count value is reset when the magnitude of the RSSI signal exceeds the upper threshold crossing limit.

Moving now to the second half-cycle, microprocessor 150 may initially increment the fault counter, as the magnitude of the RSSI signal is above the lower threshold. However, similar to the first half-cycle, the peak value of the slope threshold is at a maximum at some time after the zero-crossing region. Thus, on detection of the delayed maximum value, microprocessor 150 may reset the fault count value. Thereafter, microprocessor 150 may increment and decrement the fault count value consistent with the analysis of the RSSI signal.

In addition to analyzing the timing of the maximum or "peak hold" value of the slope of the RSSI signal in relation to the zero-crossing region, microprocessor 150 may be configured to analyze the magnitude of the "peak hold" signal. For example, as illustrated in the third half-cycle of FIG. 8C, the magnitude of the slope of the RSSI signal never reaches a minimum slope reference threshold level. As a result, the fault count value may be decremented until the magnitude of the slope of the RSSI reaches a minimum threshold value. In the exemplary embodiment illustrated in FIG. 8C, the magnitude of the "peak hold" signal reaches a minimum slope reference threshold signal midway through the fourth half-cycle. Accordingly, because the RSSI level is above the lower threshold level and the magnitude of the "peak hold" signal exceeds the minimum slope reference threshold, microprocessor 150 may continue to increment the fault count value consistent with the disclosed embodiments.

Moving now to the fifth half-cycle, because the initial value of the RSSI signal is above the lower threshold level and because the initial magnitude of the slope of the RSSI signal is at an initial maximum, microprocessor 150 initially increments the fault count value. However, because a subsequent slope maximum is detected substantially after the rising edge of the zero crossing region, microprocessor 150 resets the fault count value. Microprocessor 150 continues to analyze the RSSI signal and increment and decrement the RSSI signal thereafter, consistent with the disclosed embodiments. For example, after resetting the fault counter in response to the slope of the RSSI signal, microprocessor 150 increments the fault count value, as the magnitude of the RSSI signal exceeds the lower threshold level. However, microprocessor 150 subsequently resets the fault count value in response to detecting the sixth (and each subsequent) lower threshold crossing.

Figure 9:
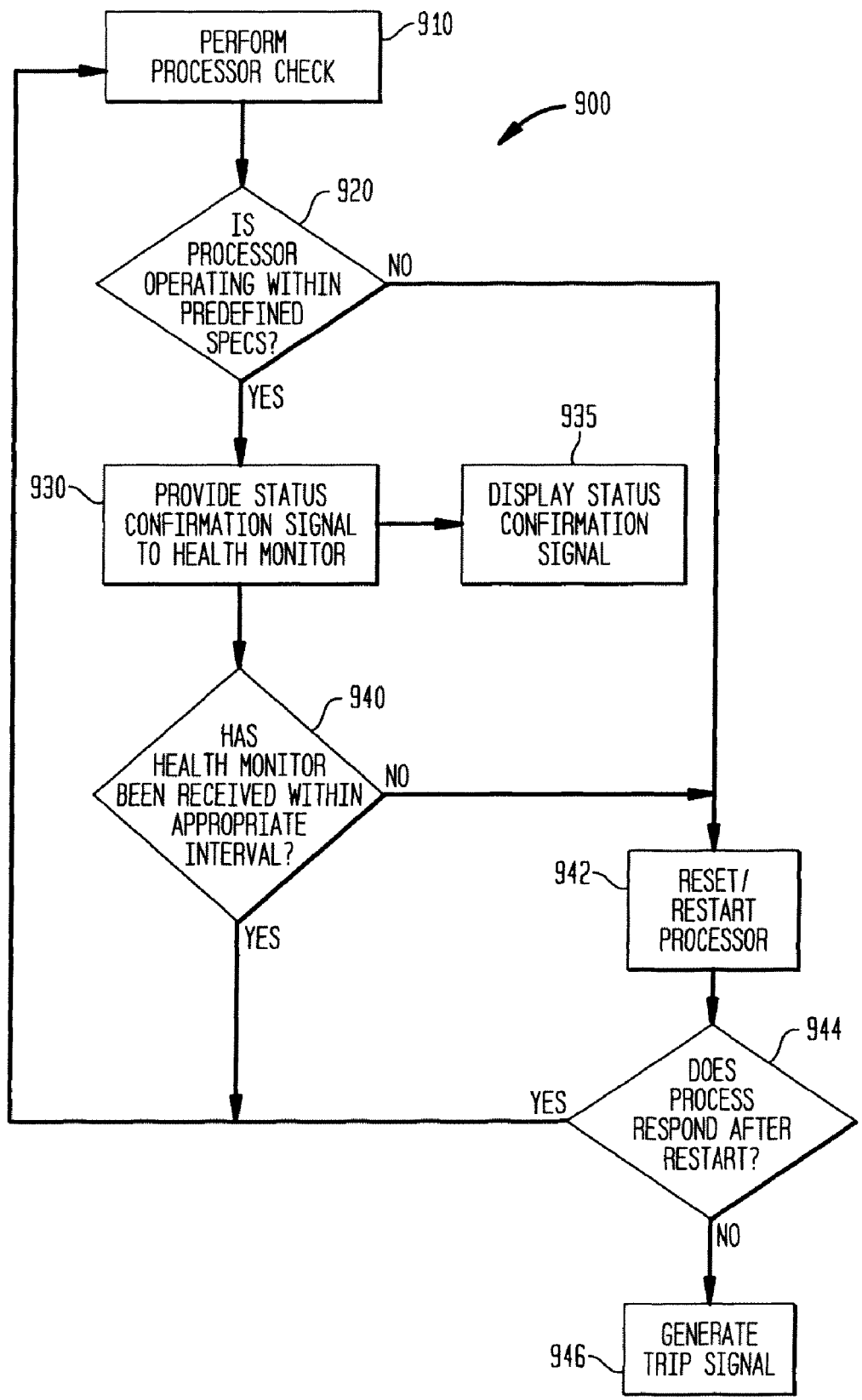
FIG. 9 provides a flowchart depicting one exemplary method associated with a process for testing the device of FIG. 1.

Processes and methods consistent with the disclosed embodiment provide a self-monitoring system for testing the status of ASIC 110 and microprocessor 150 to ensure that each system is operating in accordance with certain predetermined specifications, FIG. 9 provides a flowchart 900 depicting an exemplary self-test method performed by processor 150 and analyzed by ASIC 110.

Processor 150 may perform a self-check by polling one or more of the devices or subsystems of processor 150 (Step 910). According to one exemplary embodiment, this self-check may be initiated automatically by processor 150 to periodically verify the appropriate operation of the processor components. Alternatively, this check may be initiated by a test request provided by the user (e.g., by pressing a "push-to-test" button associated with device 100).

During the test, the processor may test each device of processor 150 either actively, by executing a test software routine, or passively, by polling the device and receiving a status indication from the device. For example, processor 150 may perform RAM checks to ensure appropriate operation of a RAM module, CRC or checksum routines to detect errors in the transmission and storage of data associated with processor 150, and/or execute watchdog timers to detect sequencing errors associated with processor 150. Processor 150 may compare test data with predetermined operational specifications for each device and determine if the device is operating within acceptable tolerances of these specifications (Step 920). If the device is operating within the predefined specifications (Step 920: Yes), processor 150 may provide a status confirmation signal (e.g., a "heartbeat" signal) to processor health monitor 138 of ASIC 110 (Step 930). Additionally, the "heartbeat" signal may be output on display 104 associated with device 100 to notify a user that the processor is operating appropriately (Step 935).

Processor health monitor 130 of ASIC 110 may determine whether the heartbeat signal was received within an appropriate time interval (Step 940). For example, processor 150 may provide a self-check initiation signal to ASIC 110 upon commencement of the self-check process. ASIC 110 may start a timer that records the time elapsed between a test initiation and the reception of the heartbeat signal from processor 150. If the signal is received within a predetermined acceptable time interval (Step 940: Yes), device 100 will be allowed to continue with normal operations. If the signal is not received within an appropriate amount of time (Step 940: No) or if the processor is not operating within the predefined specifications (Step 920: No). Accordingly, ASIC 110 may reset and/or restart processor 150 in an effort to alleviate a potential problem with the processor (Step 942). If the processor responds after restart and performs a subsequent startup self-check appropriately (Step 944: Yes), device 100 will continue with normal operation. If, however, the processor does not respond after restart or fails to pass the startup self-check (Step 944: No), device 100 may generate a trip signal to actuate a circuit interrupting device (Step 946).

With complementary means of evaluating the proper operation and functionality of each of the critical blocks (i.e. ASIC and microprocessor) there is an added layer of protection that assures that, if there is a potential failure by the microprocessor 150 or the ASIC 110, the device has means of disabling itself from protection.

Figure 10:
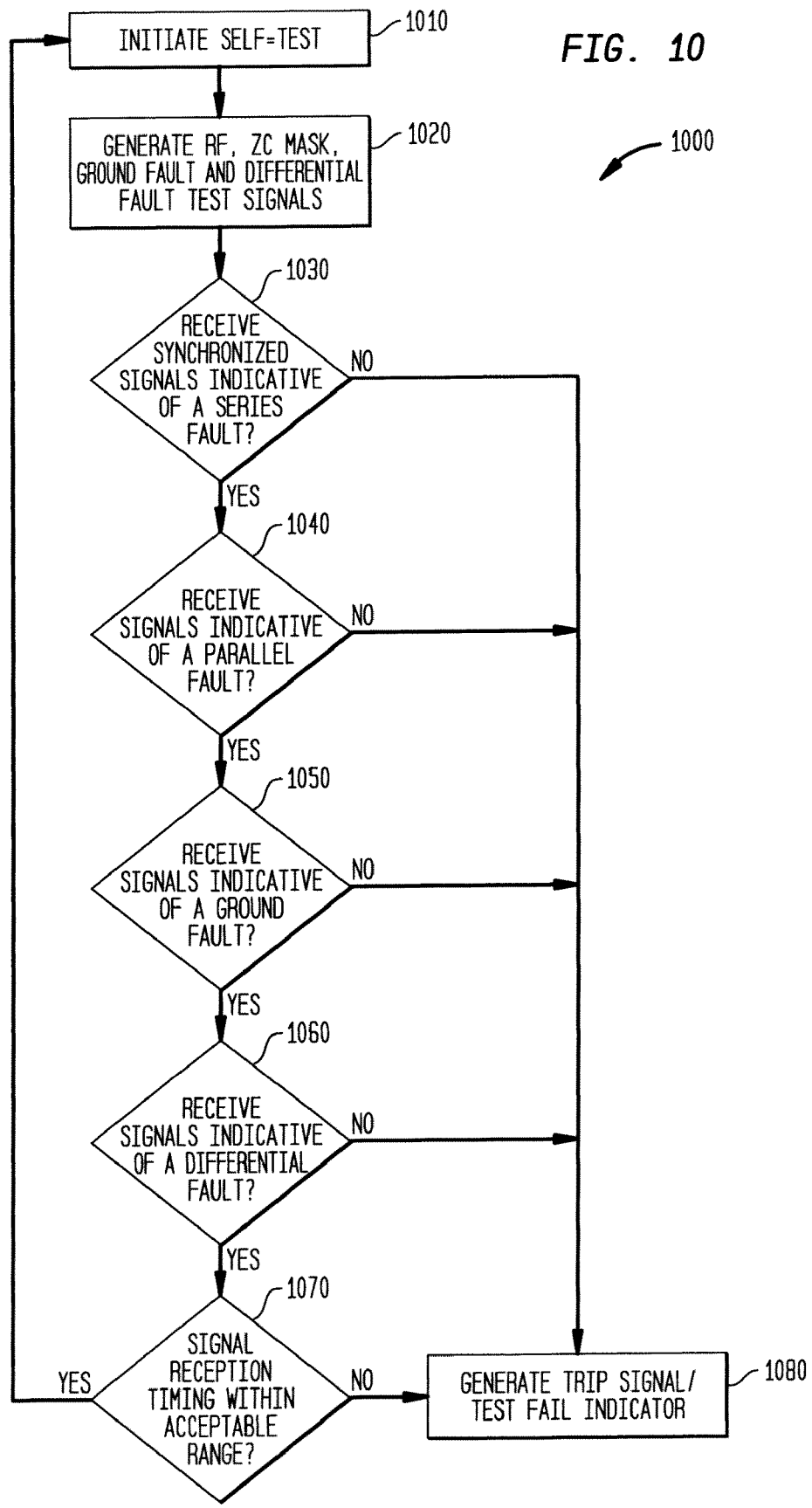
FIG. 10 provides a flowchart depicting another exemplary method associated with a process for testing the device of FIG. 1.

FIG. 10 provides a flowchart 1000 depicting an exemplary disclosed ASIC test process. ASIC test process may be initiated (Step 1010) by microprocessor 150 either automatically or in response to a user-prompted test request. A successful user-prompted test will result in a trip signal and thus fully testing all aspects of the electronics providing GFCI and/or AFCI protection. On the other hand, a test process initiated by the microprocessor 150 will only result in a trip signal if the test process renders a failure result.

As illustrated in FIG. 10, the test process may be executed in a cascade (i.e., sequential) manner. For example, according to one exemplary embodiment, the test process may first analyze a series-arc fault detection module to test for proper operation of one or more of the components and subsystems associated therewith. The test process may then proceed to analyze the parallel arc-fault detection module to test for proper response to parallel-arc fault conditions. Subsequently, the test process may proceed to analyze the differential and/or ground-fault detection modules (either in parallel or in series) to ensure proper response to differential and ground-fault conditions.

As an alternative to performing the test process for each component in series, microprocessor 150 may be adapted to perform each of these processes in parallel and/or separately from one another (e.g., at different time intervals). For example, in a self-test process, microprocessor 150 may be configured to perform test processes associated with each detection module at predetermined time intervals (e.g., hourly, daily, weekly). The time interval for each detection module may be substantially similar. Alternatively, time intervals may be staggered to reduce any processing burdens that may be associated with simultaneously and/or sequentially testing each of the modules. Thus, the timing and/or sequence of test processes illustrated in FIG. 10 is exemplary only and not intended to be limiting.

Microprocessor 150 may provide a test command signal to prompt RF noise generator 140, test signal oscillator 142, and GFCI stimulus oscillator 144 to generate respective RF signals, AC load signals, ground fault and differential test fault signals (Step 1020). In response to this test command signal, each of RF noise generator 140, test signal oscillator 142, and GFCI stimulus oscillator 144 may generate test signals for testing the hardware and/or software components of the respective module. Test processes for each of series-arc fault detection module, parallel-arc fault detection module, and differential and/or ground-fault detection module will now be described in detail.

In response to a test command signal from microprocessor 150, RF noise generator 140 may generate a broadband noise signal for testing operation of the series-arc fault detection module. This broadband noise signal may include any RF signal that comprises sufficient similarities to an actual series arc-fault signal to test each of the series arc-fault monitoring and analysis functions, but that will fail to meet all of the analysis requirements necessary to trigger detection of a fault condition. For example, the broadband noise signal may be configured with sufficient interruptions in the signal to reset the fault count value before the fault count value reaches the threshold fault count value.

According to one exemplary embodiment, RF noise generator 140 may be configured to generate a nuisance-type signal that, although sharing many of the same characteristics of a series-arc signal (e.g., broadband signal characteristics, slope characteristics, instantaneous rush of high-amplitude activity at zero-crossing, etc.), may contain too large a number of amplitude interruptions (or "gaps") to trigger a series-arc fault condition. While resembling some portions of an arcing condition, the characteristics of the broadband noise signal may advantageously be such that other AFCI devices in proximity to device 100 that may detect the broadband noise signal do not trip unnecessarily. This nuisance signal may include, for example, a signal adapted to behave similar to a broadband power line (BPL) communication device. Furthermore, this signal may be selected to exercise a plurality of analysis techniques employed by device 100, such as, for example, fault count value adjustments, applications of the weighted threshold and fault count rates, counting of the number of threshold crossings, counter incrementing and/or decrementing processes, slope analysis techniques (e.g., peak hold, slope calculations, etc.), and generation of the series-arc fault trip signal.

In response to the generation of the test signal, microprocessor 150 may be configured to establish a test fault count value threshold. The test fault count value threshold may be lower than the threshold fault count value used under "normal" (i.e., non-test) operation of the device. Because the RF test signal is specifically designed not to trip device 100 under "norma" operations, the establishment of a test fault count value threshold that is lower than the threshold fault count value may: 1) provide sufficient time to determine whether the components and/or subsystems of the series-arc fault detection module are operating appropriately, without having to establish a predetermined time window for analysis (otherwise, microprocessor 150 may not know when the test process is complete); and 2) provide a mechanism for ensuring that the threshold value comparison function performed by microprocessor 150 is working properly.

Alternatively and/or in addition to establishing a test fault count value threshold, microprocessor 150 may establish a time limit for successful completion of the test process. This time limit may be predetermined and may be established as sufficiently long enough to determine whether the components and/or subsystems of the series arc-fault detection module are operating appropriately, without requiring the device to forego "normal" operations for too long while conducting the test According to one exemplary embodiment, this time period may correspond with substantially the same time typically required to successfully identify a series arc-fault (e.g., five (5) power signal half-cycles).

Upon establishing the test fault count value and/or the test time limit, microprocessor 150 may be configured to monitor the response of each of the hardware and/or software components of the series-arc fault detection module in order to ensure proper response to the broadband noise signal. According to one embodiment, only microprocessor 150 is aware that device 100 is under test. Thus, microprocessor 150 is configured to determine whether device 100 is as responsive to the broadband noise signal as during normal operations of the circuit.

According to one embodiment, microprocessor 150 may be configured to analyze the RSSI and slope amplitude data relative to the upper and lower threshold limits and compare this data with the broadband noise signal generated by RF noise generator 140 to determine whether the threshold analysis functions of the series arc-fault detection module are operating appropriately. If one or more of the threshold analysis functions is not operating according to predetermined specifications, microprocessor 150 may generate a test fault failure signal.

Microprocessor 150 may also be configured to determine whether the upper and lower threshold crossing counters are working properly, based on the RSSI amplitude data received from ASIC 110. For example, microprocessor 150 may ensure that each threshold crossing instance is accompanied by a corresponding change in an appropriate threshold counter. If one or more of the threshold crossing counters is not operating according to predetermined specifications, microprocessor 150 may generate the test fault failure signal.

Microprocessor 150 may also be configured to determine whether the slope analysis functionality of ASIC 110 is operating appropriately. For example, if during a particular clock pulse, the amplitude of the RSSI signal crosses from below the lower amplitude threshold to above the upper amplitude threshold, microprocessor 150 may ensure that this change, which is indicative of a dramatic change in the slope of the RSSI signal, is accompanied by a corresponding change in the slope value provided by ASIC 110.

Microprocessor 150 may also be configured to analyze adjustment to the fault count value. For example, in addition to monitoring whether ASIC 110 property recognizes changes in amplitude of the RSSI signal, microprocessor 150 may also be configured to ensure that that fault count value is adjusted properly based on the amplitude of the RSSI signal. For example, microprocessor 150 may monitor the fault counter to ensure that when the amplitude of the RSSI signal is below a lower amplitude threshold that the fault count value is reduced by the appropriate weight factor.

According to one embodiment, microprocessor 150 must observe proper functionality of each of the analysis features during the test process before one or more of the fault count value exceeds a test fault count value threshold and the expiration of the testing time period. If one or more of the conditions are not met, microprocessor 150 may generate a test failure signal that stores a test failure condition in memory (for future retrieval and display) and causes a trip circuit to trip device 100. If, on the other hand, microprocessor 150 determines that each of the analysis features is functioning appropriately, microprocessor 150 may analyze parallel-arc fault, ground fault, and differential fault test processes.

Similar to RF noise generator, test signal oscillator 142 may generate a signal indicative of a parallel arc-fault condition and the GFCI stimulus oscillator 144 may generate an AC load signal indicative of ground and differential faults, respectively In contrast with the RF test signal, however, the signals indicative of parallel arc-fault and ground and differential fault conditions are sufficient to actually trip the breaker. Accordingly, microprocessor 150 suppresses trip signals generated by parallel-arc fault and ground/differential fault detection modules, as long as each module trips within the appropriate time period.

For example, microprocessor 150 may monitor the time elapsed between generation of each of the test signals for analyzing parallel arc-fault detection module 132, ground fault detection module 134, and differential fault detection module 136. In response to the respective test signal, each of the modules may generate a trip signal. If the time elapsed between the generation of the test signal and the generation of the trip signal in response to the test signal is less than a threshold time limit, microprocessor 150 suppresses the trip signal (i.e., does not deliver the trip signal to the trip circuit). If, one the other hand, the time elapsed exceeds the threshold time limit, microprocessor 150 passes the trip signal to a trip circuit to trip the device.

Upon initiating the self-test, processor 150 may await responses from each of the fault detection subsystems associated with ASIC 110. Because processor 150 is aware that each of the test subsystems associated with ASIC 110 are under test conditions, processor 150 may verify that each subsystem is responding in an appropriate manner associated with the processing of each respective test signal. For example, processor 150 may determine that, in response to a parallel arc-fault type signal that parallel arc fault detection system 132 is approaching a fault detection threshold. Similarly, processor 150 may determine that analog processing logic 131 has responded appropriately to the broadband communication signal contained in the RF test signal by generating the mask signal, generating and analyzing the RSSI, and rejecting the communication signal as a nuisance signal.

In steps 1030-1060, processor 150 may await confirmation that each of the test signals caused appropriate responses with their respective detection subsystems. If one or more of the test signals fail to respond appropriately, processor 150 may generate a trip signal (Step 1080) and provide a test fail indication to display 104 (Step 1030-1060: No). If all of the subsystems properly respond, processor 150 may determine whether the responses were registered within an acceptable time period. If the responses were not received within a predetermined acceptable time interval (Step 1060: No), processor 150 may generate a trip signal. If, however, the fault signals are received within an acceptable time interval (Step 1070: Yes), a test pass notification may be provided to display 104. In embodiments wherein the test is performed periodically and/or automatically, microprocessor 150 may initiate the test at predetermined intervals.

Before the device trips, the processor 150 will determine the trip condition. The trip condition will be stored in the device for a predetermined amount of time or condition. Upon reset and power-up the device will display the previous trip condition. The indication is present for a pre-determined amount of time (e.g., 5 seconds). The display of the last known trip condition may occur for a predetermined amount of time (e.g., display last known trip condition every power-up of the device to within the next 30 days). If, during this predetermined period, a new fault condition occurs, the new trip condition will be stored and reported during the next power-up for a predetermined amount of time.

According to one exemplary embodiment, for each of the self-test and user-initiated test processes, a non-arcing signal may injected upstream of the RF sensor, where the non-arcing signal avoids causing adjacent breakers to trip when they receive the injected test signal. If the series arc fault detection module associated with device 100 properly reacts to the stimulus, the processor provides an artificial signal indicative of an arc to the parallel arc fault detection module. The various series arc fault, parallel arc fault, and ground arc fault detection modules are arranged in a chain and pass failure states from one module to the next. The self-test process verifies a positive health condition of each module before a timer expires and then stops the test stimulus before a tripping condition arises, thereby preventing device 100 from tripping. In contrast, the push-to-test process verifies a positive health condition of each module before the time expires and generates a test trip signal, which trips device 100. Before tripping, however, processor 150 stores the trip condition as a test trip, indicating that the trip resulted from successful completion of the push-to-test process (as opposed to an actual fault condition.)

As an alternative embodiment of the self-test sequence the test signal oscillator 142 may be implemented as a direct current source. Once the self-test has been initiated, the RF coupler 107 and the RF front end 120 are stimulated by the RF oscillator block, which can reside in the ASIC 110 or the microprocessor 150. The stimulus may contain a broadband high frequency component modulated by a low frequency component. The stimulus may propagate to analog processing logic 131 allowing for its outputs to render an according response that will be captured by the microprocessor 150, which then provides stimulus into parallel arc fault detection circuit. The ASIC health logic block detects proper function of the parallel arc fault block and sends out a stimulus (DC current) to the 50/500 mA differential fault detection block. ASIC health logic receives a response from the differential fault detection block and sends out a stimulus (DC current) to 5 mA GFCI fault detection block which immediately sends a stimulus (a much higher DC current) to the 50/500 mA GFCI which immediately sends the internal trip signal back into the ASIC health logic. The ASIC health logic delays the internal trip signal by a small amount of time (e.g., 25 microseconds) while it pulls the self-test (microprocessor-initiated test process) signal low and stops the microprocessor-initiated test process before the trip signal is sent to the SCR driver. The microprocessor detects self-test signal line is low and disables stimulus into the parallel arc fault detection block 132, which stops the series of chain stimulus to all portions of the circuit under test. Also, it is contemplated that, instead of providing a separate test signal oscillator for generating a test signal associated with the parallel, GFCI, and differential detection systems, the local oscillator used in the RF front end may be used to generate test signals for these systems.

In addition some of the component implemented can be consolidated or integrated for the purpose of component reduction or increased efficiency of the system. For example, device 100 may implement a single oscillator block, combining the functions of, for example, test signal oscillator 142 and the GFCI stimulus oscillator 144.

Although certain processes and methods are described as being performed in by one of ASIC 110 or microprocessor 150, these processes may be performed by either one or both of ASIC 110 and/or microprocessor 150, without departing from the scope of the present disclosure. Moreover, device 100 may include multiple microprocessors and/or ASIC circuits, each adapted to perform at least one task associated with the arc fault detection.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Figure 11:
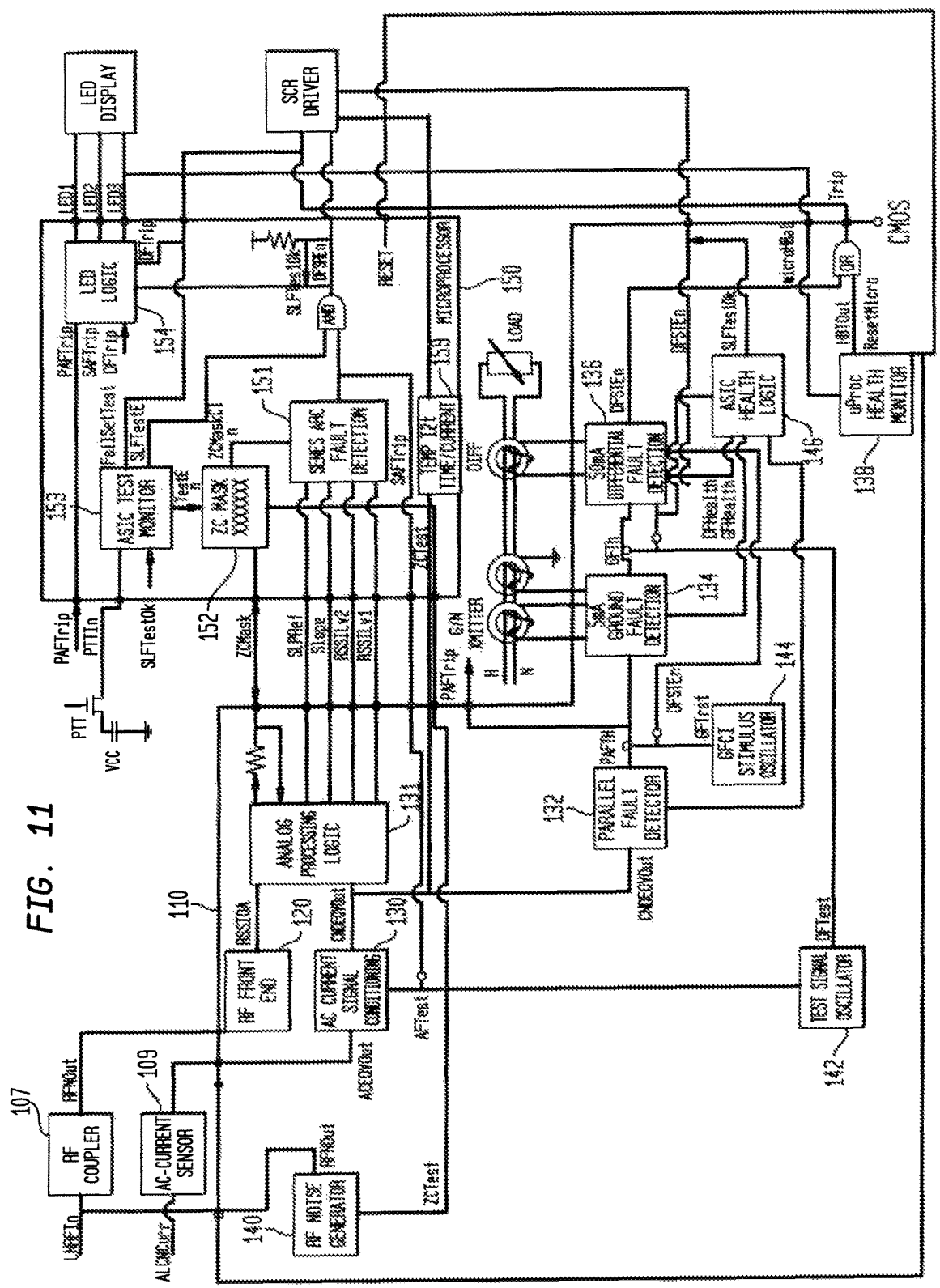
FIG. 11 provides a schematic representation of a combination arc fault circuit interrupter/ground fault circuit interrupter device in accordance with another embodiment of the invention.

Referring to FIG. 11, there is shown a schematic diagram of circuit breaker device 100' in accordance with another embodiment of the invention. Circuit breaker device 100' operates in substantially the same electromechanical environment as shown in FIG. 2 herein with the exception that a bimetal element is not used. Instead, circuit breaker device 100' uses time/current curves (stored data) to determine when a circuit breaker should trip. In a preferred embodiment, the circuit breaker device shown in FIG. 11 utilizes a magnetic override system 1500 to initiate an instantaneous trip in case an overload current exceeds 10× breaker rating current (Amps). Such an overload current is designated by region four (4) in the curve of FIG. 12. Circuit breaker device 100' is preferably implemented through the use of a single CMOS ASIC (Application Specific Integrated Circuit) in order to minimize costs and assembly time. However, other electronic mixed signal (Analog and digital) processing technology (e.g. Bipolar & BICMOS etc.) may also be used without departing from the scope of the invention as shown in FIG. 13.

Figure 13:
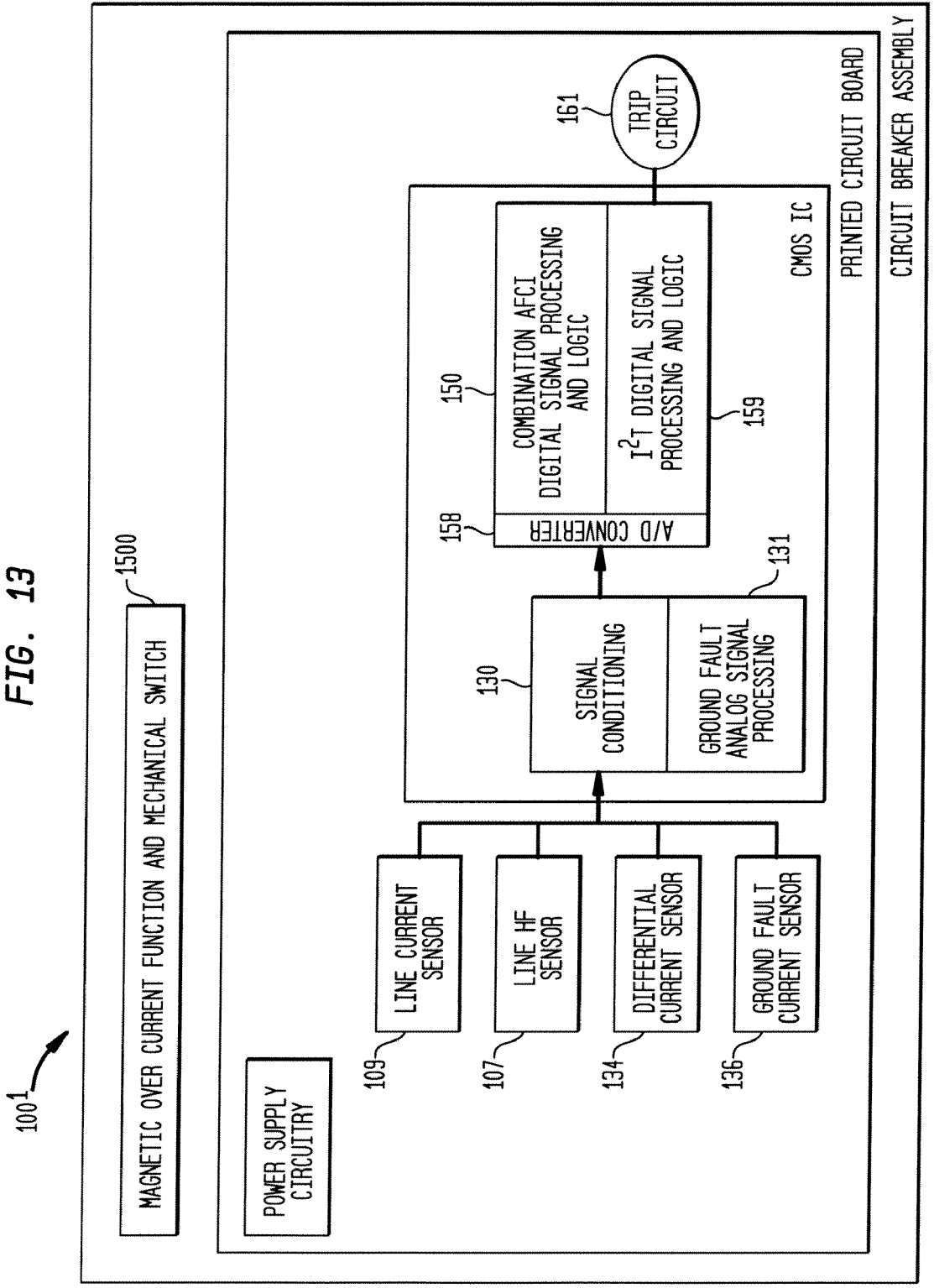
FIG. 13 is a general block diagram of the interrupter device shown in FIG. 11.

Referring to FIG. 13, there is shown a block diagram of circuit breaker device 100'. Circuit breaker device 100' utilizes four inputs to determine whether circuit breaker 100' should be tripped. Specifically, circuit breaker device 100' comprises AC line current sensor 109 described previously herein (see FIG. 2). Circuit breaker device 100' further comprises line high-frequency sensor (or RF coupler) 107 described previously herein (see FIG. 2). Circuit breaker device 100' also includes differential current sensor (or differential fault detector) 134 and ground fault current sensor (or differential fault detector) 136, both of which being previously described herein and shown in FIG. 2. These detectors and sensors provide current and/or voltage performance data that can be used to activate the circuit breaker. Circuit breaker device 100' further includes signal conditioner 130 and ground fault analog signal processor 131, both of which being described in the foregoing description and shown in FIG. 2. The output signals provided by sensors 107, 109, 134 and 136 are fed into signal conditioner 130. As described previously herein, signal conditioner 130 is in electronic data communication with ground fault analog signal processor 131.

Figure 12:
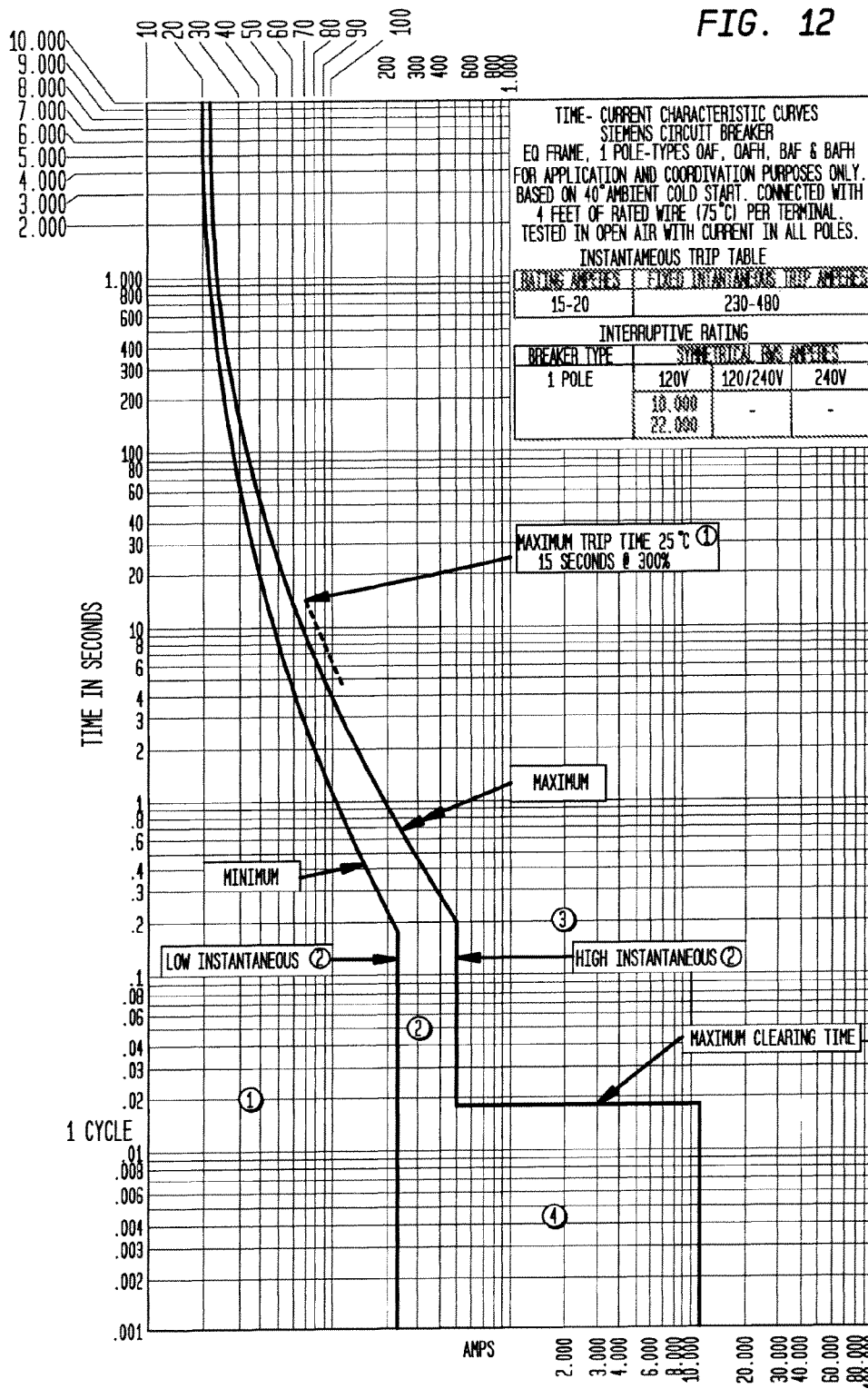
FIG. 12 shows several curves of current-time duration versus current magnitude that define a plurality of regions in which tripping may or may not occur.

Referring to FIG. 13, circuit breaker device 100' further comprises microprocessor 150, which was described previously herein and shown in FIG. 2, and A/D converter 158. A/D converter circuitry 158 converts the signals provided by signal conditioner 130 into digital signals for input into microprocessor 150. In accordance with this embodiment of the invention, circuit breaker device 100' further comprises processing resource 159. Processing resource 159 is in electronic data communication with microprocessor 150 and A/D converter 158 and is configured to implement signal processing techniques and algorithms as will be discussed in the ensuing description. Processing resource 159 comprises a microprocessor which has data storage capacity for storing digital data representing one or more time-versus-current curves. Circuit breaker device 100' uses these time-versus-current curves to determine when the circuit breaker device 100' must trip. Referring to FIG. 12, there is shown two time-versus-current curves that are used as boundaries designating the particular current magnitude and current-time duration that is used to trip a circuit breaker. The time-versus-current curves shown in FIG. 12 represent the performance constraints of a single pole circuit breaker. In accordance with this embodiment of the invention, processor resource 159 generates trip signal 161 when a certain time-current relationship is detected. Referring again to FIG. 12, with a 15-20 Amperes rating and a fixed instantaneous trip threshold (low instantaneous tripping) of 230 amps and an upper limit range of 480 amps, the two performance curves (time versus current) depict three regions of performance. The first region shows the corresponding set of data points during which no tripping will occur. The second region is bounded by the lower and/or upper boundaries of the single pole time/current characteristics. The second region is an area during which tripping will occur if the first curve is used as a minimum threshold curve. In the second region, for example, a current duration of 0.2 seconds or less and a current of more than 230 amps will cause the circuit breaker to trip. Likewise, in the third region, a current duration of 0.2 seconds or less and current of more than 480 amps will open the contacts.

Referring to FIG. 13, the aforesaid time-versus-current characteristic curves containing the time/current performance data are stored as digital data in processor resource 159. This performance data, once stored in memory, is used as a benchmark or reference to which are compared the current values outputted by AC signal conditioner 130 and sampled by A/D converter 158.

In a preferred embodiment, microprocessors 150 and 159 are configured as an all-in-one CMOS ASIC device. In an alternate embodiment, the data representing the time-versus-current curves is stored in an external memory storage device or in internal memory cells conforming part of that all-in-one CMOS ASIC.

Figure 14:
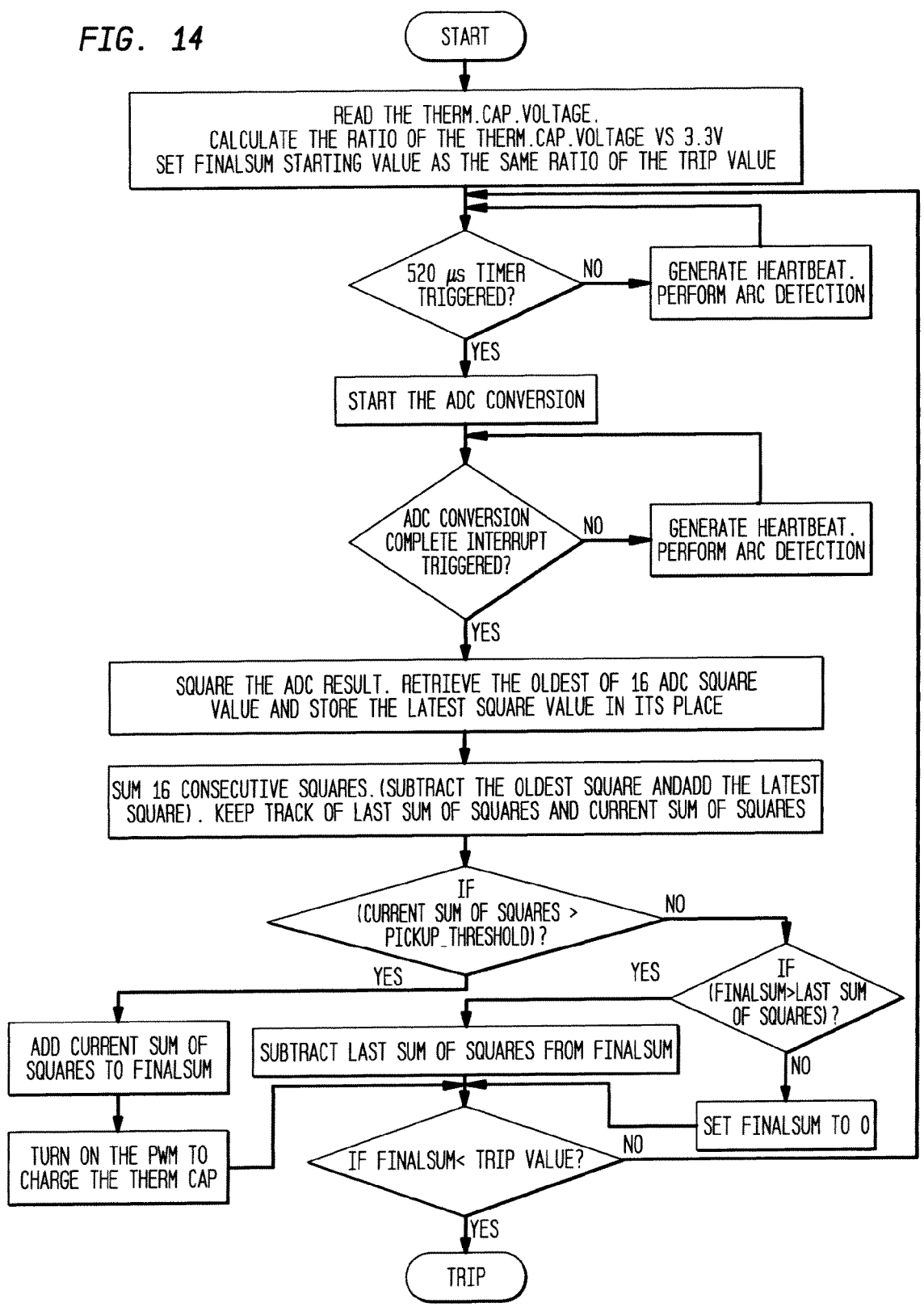
FIG. 14 is a flowchart illustrating an algorithm that is implemented by a processing resource shown in FIG. 13.

Processor resource 159 is configured to implement the algorithm shown in FIG. 14. The algorithm is initiated in step 1600. The first step is step 1602 which entails reading the thermal capacitor voltage, calculating the ratio of the thermal capacitor voltage versus 3.3 volts and setting the final sum starting value as the same ratio of the trip value. Step 1604 determines whether the timer is triggered. If the timer is not triggered, then the algorithm shifts to step 1606 which effects performance of arc detection. The algorithm then returns to step 1604. If the timer is triggered, then the algorithm shifts to step 1608. In step 1608, the analog-to-digital conversion (ADC) is initiated. Next, in step 1610, it is determined if the analog-to-digital conversion process is complete. If the analog-to-digital conversion process is not complete, the algorithm shifts to step 1612 which effects the performance of arc detection. If the analog-to-digital conversion is complete and there is an ADC result, than the algorithm shifts to step 1614. In step 1614, the ADC result is squared to provide a latest or updated ADC square value. This step also retrieves the oldest of sixteen (16) ADC square values and replaces the retrieved oldest ADC value with the latest or updated ADC square value. The algorithm then shifts to step 1616. In step 1616, several steps are performed. First, sixteen (16) consecutive ADC square values are summed to provide an ADC square value summation. Next, the oldest ADC square value is subtracted from summation. Next, the latest or updated ADC square value is added to the summation. This step also keeps track of the previous sum of ADC square values and the current sum of ADC square values. Next, in step 1618, it is determined if the current sum of the ADC square values is greater than a predetermined pickup threshold. If the current sum of the ADC square values is greater than the pickup threshold, then the algorithm shifts to step 1620. In step 1620, the current sum of the ADC square values is added to the final sum value computed in step 1602. The algorithm then shifts to step 1622. In step 1622, the pulse width modulator (PWM) is activated to charge the thermal capacitor. The algorithm then shifts to step 1624 wherein it is determined if the final sum value is greater than the predetermined trip value. If the final sum value is greater than the predetermined trip value, then the algorithm shifts to step which effects generation of a trip signal to cause the circuit breaker device to trip. If it is determined that final sum value is not greater than the predetermined trip value, then the algorithm shifts to back to step 1604.

Referring back to step 1618, if it is determined that the current sum of the ADC square-values is not greater than the predetermined pickup threshold, then the algorithm shifts to step 1628. In step 1628, it is determined if the final sum value is greater than the latest sum of the ADC squares, then the algorithm shifts to step 1630. In step 1630, the latest sum of the ADC square values is subtracted from the final sum value. The algorithm then shifts to step 1624. If step 1628 determines that the final sum value is not greater than the latest sum of the ADC squares, then the algorithm shifts to step 1632 wherein the final sum value is set to zero. The algorithm then shifts to step 1624.

Thus, operationally, as shown in FIG. 12, the output of the AC current signal conditioning 130 is not only sent to the parallel fault detector 132, but is also sent to processor resource 159 for processing. If the sensed current and the time duration places the sampled data beyond the threshold limits (beyond min and/or max curves), as for example shown in FIG. 12, a signal is sent to the SCR driver in order to trip the circuit breaker.

Thus, circuit breaker device 100' has a multitude of sensory inputs to determine whether the circuit breaker should be tripped for various reasons. It is to be understood that the signals provided by sensors 107, 109, 134 and 136 may be used individually or in any combination to establish a triggering algorithm.

A significant advantage of circuit breaker device 100' is that the bimetal function is entirely replaced by the stored time-versus-current curve or curves. Functionally, the bimetal under an overload condition heats up and bends to unlatch a spring operated trip mechanism in response to sustained over-current. However, circuit breaker device 100' eliminates the bimetal thereby reducing costs, improving assembly, and rendering the circuit breaker more reliable.

While the foregoing description is exemplary of the present invention, those of ordinary skill in the relevant arts will recognize the many variations, alterations, modifications, substitutions and the like are readily possible, especially in light of this description, the accompanying drawings and the claims drawn hereto. In any case, because the scope of the invention is much broader than any particular embodiment, the foregoing detailed description should not be construed as a limitation of the present invention, which is limited only by the claims appended hereto.

What is claimed is:

1. An electrical fault detection device for use in a branch of a power circuit, comprising:
   an AC line current sensor for monitoring the AC current in an electrical distribution line comprising a primary line and neutral line and carrying an AC power signal the AC line current sensor generating a representative signal proportional to the load current delivered to at least one branch of a power circuit;
   a line high-frequency sensor coupled to the electrical distribution line for detecting and outputting a broadband high-frequency component of the AC power signal;
   a differential current sensor coupled to the primary and neutral lines of the electrical distribution line for monitoring the net current between the primary line and neutral line, comparing the net current with the AC load current signal and generating a signal that indicates whether the net line-to-neutral current is inconsistent with a load current by a predetermined acceptable amount;
   a ground fault current sensor for detecting a current imbalance between the primary and neutral lines of the electrical distribution line;
   a signal conditioner in electrical signal communication with the AC current line current sensor, the line high frequency sensor, the differential current sensor and the ground fault current sensor and adapted to generate a signal indicative of the load current associated with a branch of the power circuit;
   a sampling circuit for sampling the signal outputted by the signal conditioner and generating a sampled signal; and
   a processing resource for processing the sampled signal, the processing resource having stored therein data representing a plurality of time-versus-current curves that define a plurality of regions in which tripping may or may not occur, wherein at least one region has time data and current data that define a time duration for a particular current magnitude for which no tripping will occur, and wherein at least one other region has time data and current data that define a time duration for a particular current magnitude for which tripping will occur, the processing resource processing the sampled signal to (i) provide processed time data and current data, (ii) determine the region to which the processed time data and current data correspond, and (iii) generating a signal to initiate tripping if the sampled signal yields time data and current data that corresponds to a region for which tripping must occur.

2. The electrical fault detection device according to claim 1 wherein the AC line current sensor comprises a transformer coupled to the primary and neutral lines.

3. The electrical fault detection device according to claim 1 wherein the AC line current sensor comprises a metallic strap of known impedance in series with the load that provides an output signal indicative of the current travelling through the distribution line.

4. The electrical fault detection device according to claim 1 wherein the AC line current sensor comprises a temperature sensor.

5. The electrical fault detection device according to claim 1 wherein the line high-frequency sensor comprises a high-frequency coupling transformer for collecting high-frequency signals from the distribution line.

6. The electrical fault detection device according to claim 1 wherein the line high-frequency sensor comprises a toroidal-shaped ferrite sensor for collecting high-frequency signals from the distribution line.

7. The electrical fault detection device according to claim 1 wherein the line high-frequency sensor comprises a high pass filter device that allows the passage of high-frequency signals and rejecting low-frequency signals.

8. The electrical fault detection device according to claim 1 wherein the differential current sensor comprises comparator circuitry for comparing the net current with the AC load current signal and outputting the signal that indicates whether the net line-to-neutral current is inconsistent with a load current by a predetermined acceptable amount.

9. The electrical fault detection device according to claim 1 wherein the ground fault current sensor comprises a toroid in electrical signal communication with the primary and neutral lines such that a grounded neutral fault forms a magnetic path that passes through the grounded neutral toroid to allow the toroid to induce an oscillatory wave on both the primary and neutral lines, wherein induced current flows only in the neutral line due to the grounded neutral fault path.

10. The electrical fault detection device according to claim 1 wherein the signal conditioner comprises an AC current conditioning system which comprises a transformer that is coupled to the signals provided by the AC current line current sensor, the line high frequency sensor, the differential current sensor and the ground fault current sensor and which provides a representative signal that is proportional to the low frequency load current.

11. The electrical fault detection device according to claim 1 wherein the sampling circuit comprises an analog-to-digital converter that is in electric signal communication with the signals outputted by the signal conditioner.

12. The electrical fault detection device according to claim 1 wherein the processing resource comprises a microprocessor.

13. A method for electrical fault detection comprising:
monitoring the AC current in an electrical distribution line comprising a primary line and neutral line and carrying an AC power signal;
generating a representative signal proportional to the load current delivered to at least one branch of a power circuit;
detecting and outputting a broadband high-frequency component of the AC power signal;
monitoring the net current between said primary line and neutral line;
comparing said net current with the AC load current signal and generating a signal that indicates whether the net line-to-neutral current is inconsistent with a load current by a predetermined acceptable amount;
detecting a current imbalance between the primary and neutral lines of the electrical distribution line;
generating a signal indicative of the load current associated with a branch of the power circuit, wherein said signal indicative of the load current is based on (i) said representative signal that is proportional to the load current delivered to at least one branch of a power circuit, (ii) said detected broadband high-frequency component of the AC power signal, (iii) said signal that indicates whether the net line-to-neutral current is inconsistent with a load current by a predetermined acceptable amount, and (iv) said detected current imbalance between the primary and neutral lines of the electrical distribution line;
sampling said signal indicative of the load current associated with a branch of the power circuit;
providing a processing resource having stored therein data representing a plurality of time-versus-current curves that define a plurality of regions in which tripping may or may not occur, wherein at least one region has time data and current data that define a time duration for a particular current magnitude for which no tripping will occur, and wherein at least one other region has time data and current data that define a time duration for a particular current magnitude for which tripping will occur; and
processing the sampled signal with the processing resource to (i) provide processed time data and current data, (ii) determine the region to which the processed time data and current data correspond, and (iii) generating a signal to initiate tripping if the sampled signal yields time data and current data that corresponds to a region for which tripping must occur.

* * * * *